United States Patent [19]

Shinomiya et al.

[11] Patent Number: 5,852,562
[45] Date of Patent: Dec. 22, 1998

[54] METHOD AND APPARATUS FOR DESIGNING AN LSI LAYOUT UTILIZING CELLS HAVING A PREDETERMINED WIRING HEIGHT IN ORDER TO REDUCE WIRING ZONES

[75] Inventors: Noriko Shinomiya, Osaka; Masahiko Toyonaga, Hyogo; Masahiro Fukui; Toshiro Akino, both of Osaka, all of Japan

[73] Assignee: Matsushita Electric Industrial Co., Ltd., Osaka, Japan

[21] Appl. No.: 571,130

[22] Filed: Dec. 12, 1995

[30] Foreign Application Priority Data

Dec. 13, 1994 [JP] Japan .................................. 6-308508
Feb. 9, 1995 [JP] Japan .................................. 7-021869

[51] Int. Cl.$^6$ ............................ G06F 17/00; G06F 17/50
[52] U.S. Cl. ..................... 364/491; 364/490; 364/489; 364/488
[58] Field of Search .................................. 364/488–491, 364/578; 395/500

[56] References Cited

U.S. PATENT DOCUMENTS

| | | | |
|---|---|---|---|
| 4,400,712 | 8/1983 | O'Connor ................................. | 357/44 |
| 5,159,682 | 10/1992 | Toyonaga et al. ....................... | 395/500 |
| 5,187,668 | 2/1993 | Okude et al. ........................... | 364/468 |
| 5,267,177 | 11/1993 | Sato et al. ............................... | 364/491 |
| 5,272,645 | 12/1993 | Kawakami et al. ..................... | 364/491 |
| 5,506,788 | 4/1996 | Cheng et al. ............................ | 364/491 |

OTHER PUBLICATIONS

Koide et al. "A New Global Routing Algorithm for Over–the–Cell Routing in Standard Cell Layouts," IEEE, 1993, 116–121.

Bhingarde et al. "Over–the–Cell Routing Algorithms for Industrial Cell Models," IEEE, 1996, pp. 143–148.

Cherng et al. "An Efficient Over–the–Cell Channel Router," IEEE, 1993, pp. 133–137.

Holmes et al. "Algorithm for Three–Layer Over–the–Cell Channel Rating," IEEE, 1991, pp. 428–431.

Wang et al. "Topological Cell Compaction Via Transistor Rotation," IEEE, 1991, pp. 909–912.

Madhwapathy et al. "An Efficient Four Layout Over–the–Cell Router," IEEE, pp. 187–190, Jun. 1994.

Lin et al. "Cell Height Reduction by Routing Over–the–Cells," IEEE, pp. 2244–2247, May 1992.

Bo Wu et al., "Over–the–Cell Router for New Cell Model," 29th ACM/IEEE Design Automation Conference, pp. 604–607, 1992.

H. Shin et al., "Two Dimensional Compaction By 'Zone Refining'", 23rd Design Automation Conference, pp. 115–122, 1986.

*Primary Examiner*—Kevin J. Teska
*Assistant Examiner*—Vuthe Siek
*Attorney, Agent, or Firm*—McDermott, Will & Emery

[57] ABSTRACT

To reduce a circuit block in area, the present invention provides an LSI layout design method having a cell changing processing for reducing a pure wiring zone in area.

By an input processing, circuit design information and cell library are entered. Then, a layout of cells arranged in a plurality of cell rows is designed by a cell placing processing. Then, the height of a wiring zone required between cell rows is estimated by a wiring zone height estimating processing. To reduce the area of a pure wiring zone other than the over-the-cell wiring zones, each of placed cells is changed, by a cell changing processing, to a cell having the same specifications and a different shape or a different terminal position. A layout of cell interconnection is designed by a wiring processing. Based on the layout thus obtained by the processings above-mentioned, a mask pattern is prepared and supplied by a mask pattern preparing processing.

6 Claims, 31 Drawing Sheets

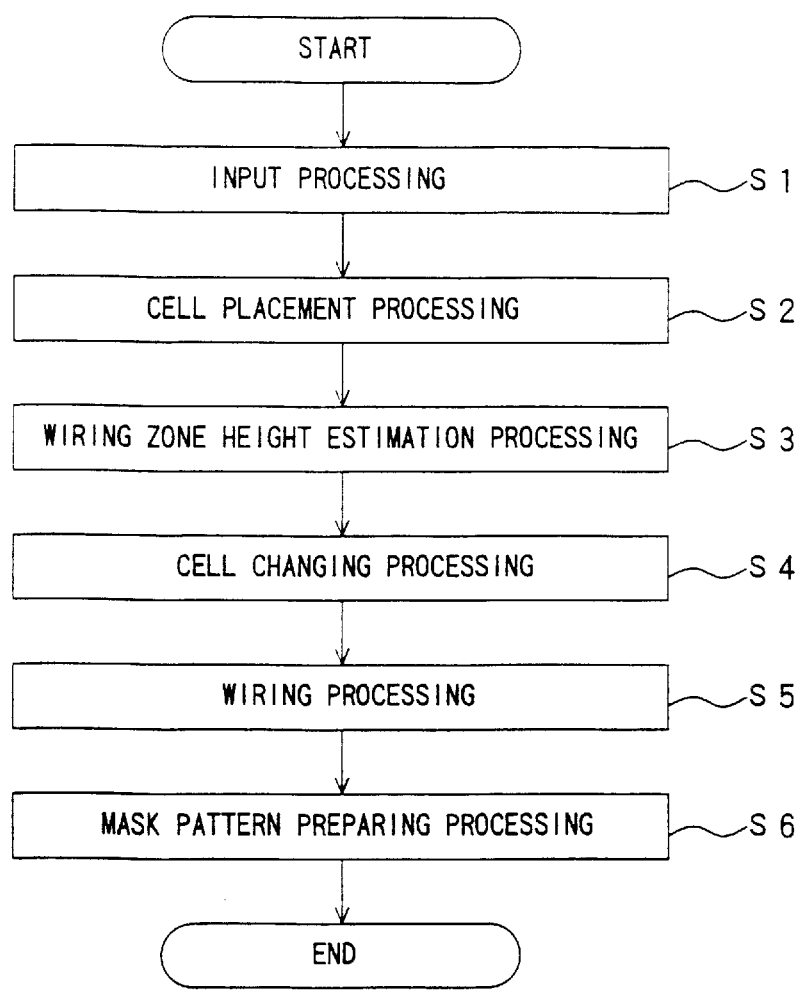

F I G. 3
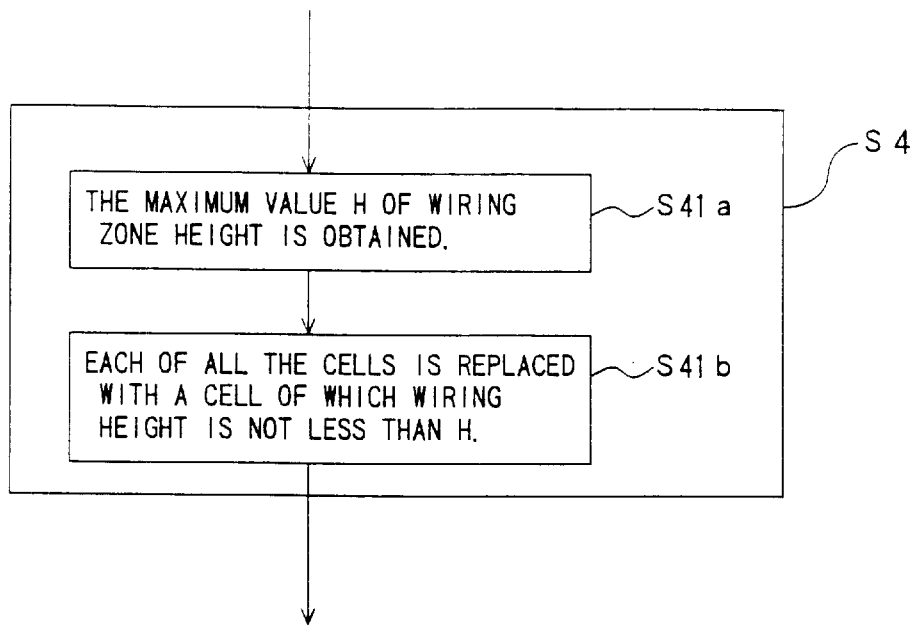

F I G. 5
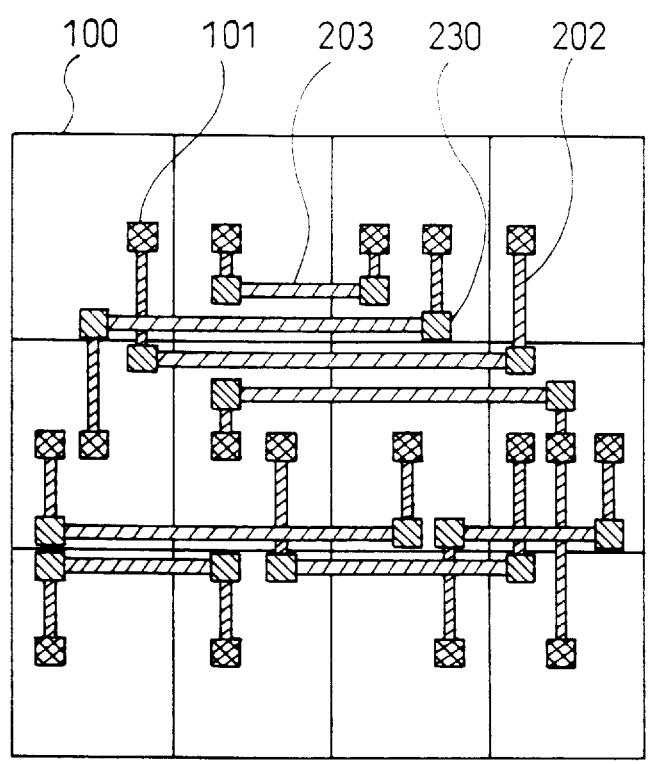

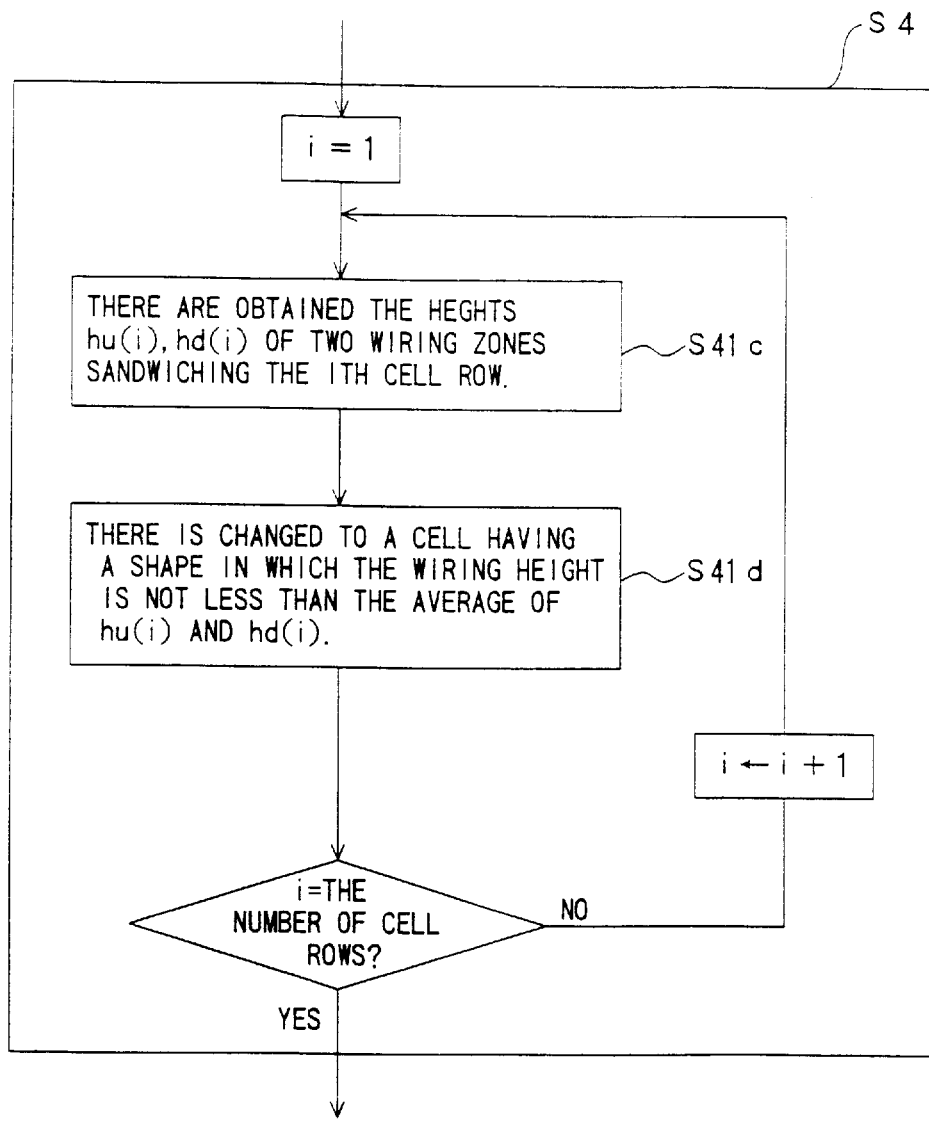

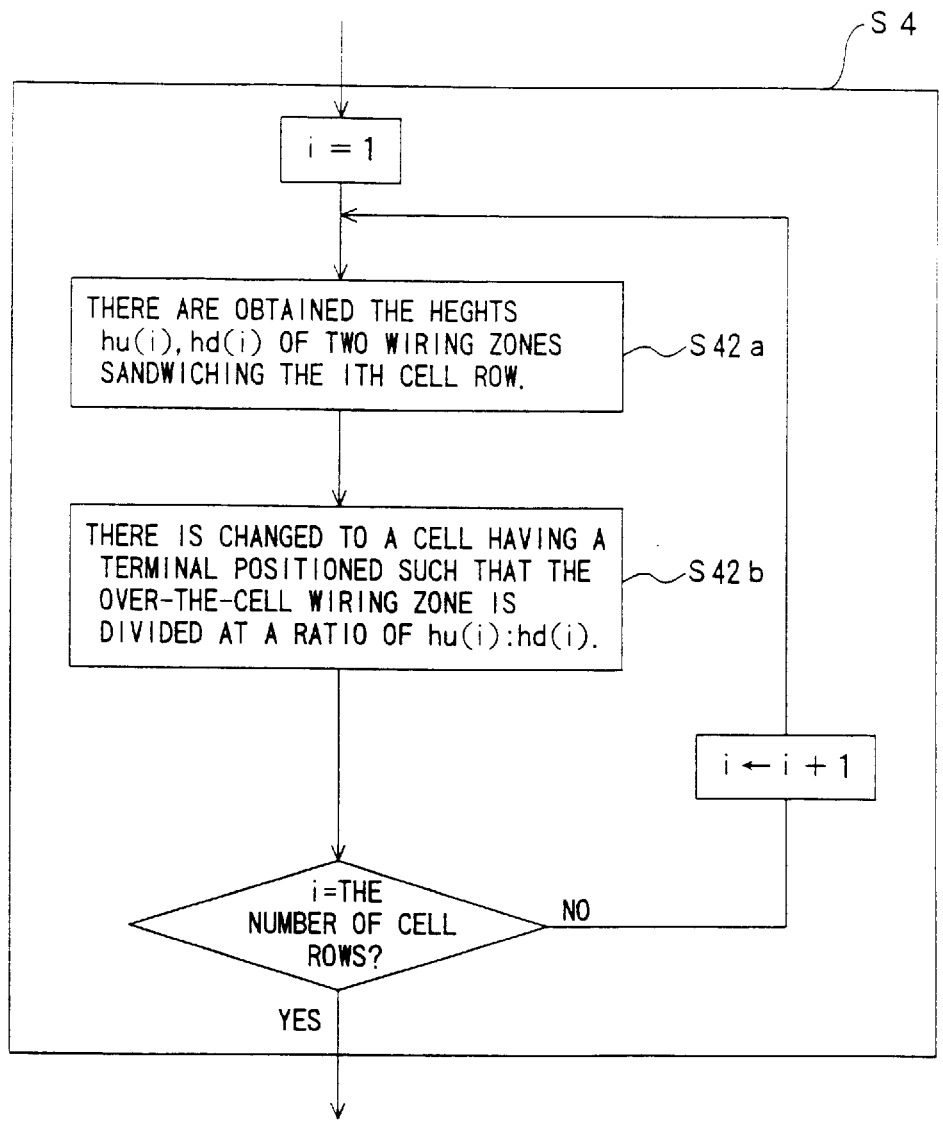

F I G. 13
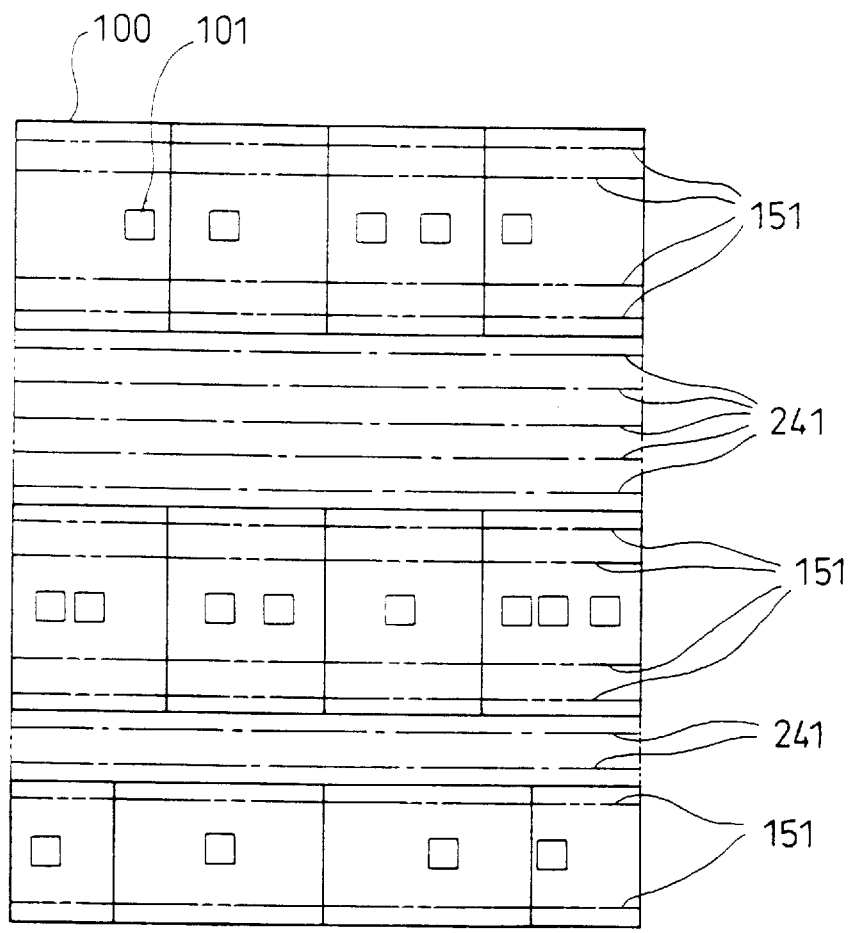

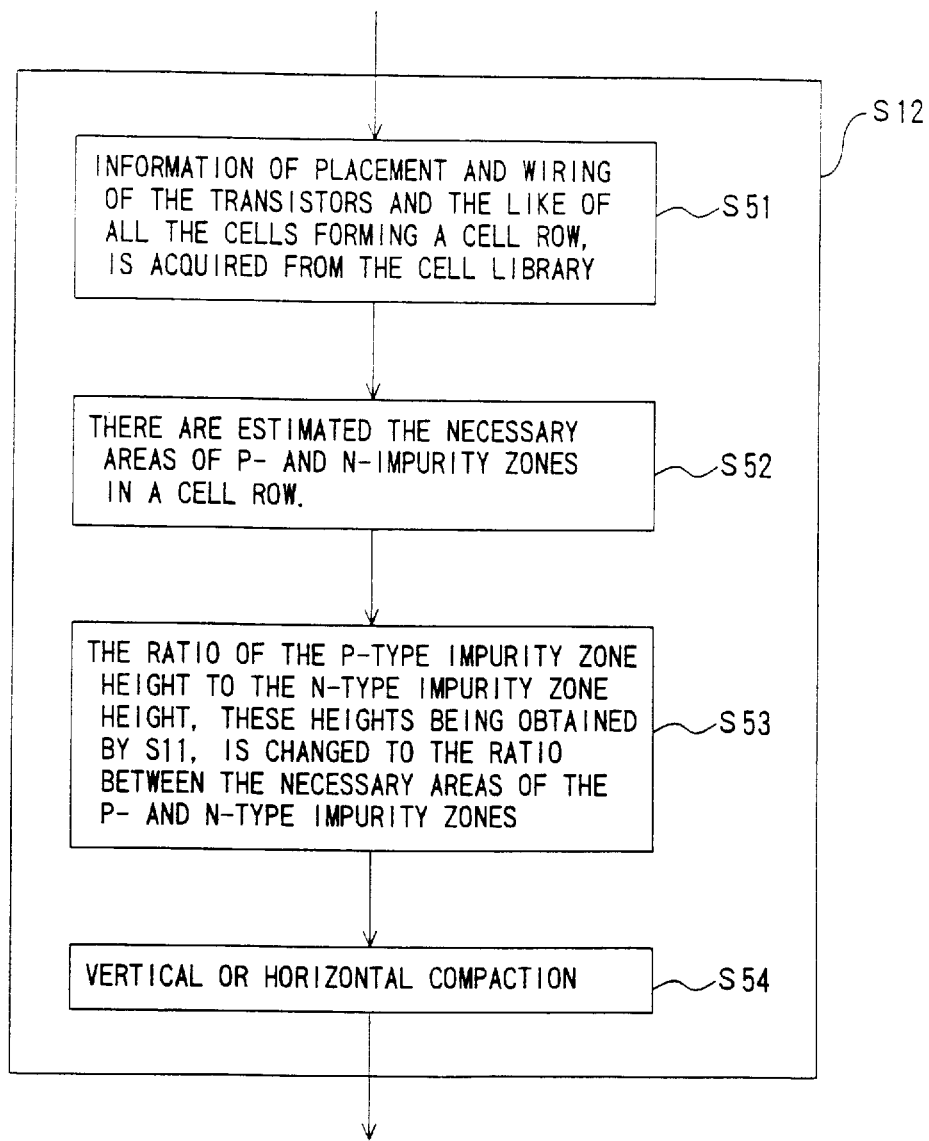

METHOD AND APPARATUS FOR DESIGNING AN LSI LAYOUT UTILIZING CELLS HAVING A PREDETERMINED WIRING HEIGHT IN ORDER TO REDUCE WIRING ZONES

BACKGROUND OF THE INVENTION

The present invention relates to method of and apparatus for designing a layout of a large-scale integrated circuit (LSI), and more particularly to method of and apparatus for designing an LSI layout with the object of reducing the circuit block in area.

There have recently been utilized, in a variety of fields, so-called large-scale integrated circuits (LSI) each having a plurality of circuits formed on a semiconductor substrate. On the other hand, an LSI is increasingly improved in components per chip because of the development of production technology such as fine machining or the like.

With the improvement of an LSI in components per chip, there is developed a design support technology for an efficient circuit design. In a layout design of preparing, according to a result of logic design, a mask pattern serving as a mask original picture in LSI production, there are also achieved a variety of design automation (DA) methods. Further, there are also proposed some layout design methods to minimize the area of a circuit block in order to lower the production cost.

FIG. 24 is a flow chart illustrating the flow of a basic processing of a layout design method of prior art.

By an input processing S1, cell interconnection data obtained by logic design and cell library data are entered and stored in a memory of a calculator.

After completion of logic design, the cell interconnection data are to be supplied, as a net list, from a logic circuit data base or the like. In a net list, there are described cell names, terminal names and signal names to represent the cell interconnection information, as seen in the input form of circuit information in a logic simulator Verilog (commercially available product). The terminals for which the same signal name is described, must be connected to each other by wiring in the layout design.

Cell library data refer to the information of the cells prepared in an LSI design and contain both the information of the logic functions of the cells and the layout information of the transistors for achieving the logic functions. Generally, there is prepared only one type of a cell for each specific logic function. There are also instances where there are prepared cells having different transistor drive abilities, yet having the same logic function.

By a cell placement processing S2, the cells described on the net list are selected from the cell library to design a placement zone composed of a plurality of cell rows. As to a cell placement, there have conventionally been proposed a variety of methods.

The following description will discuss, as an example, a pairwise interchange method. The pairwise interchange method is a method of obtaining, while cell positions are randomly interchanged, a layout in which there is minimized the value of a placement evaluation function which numerically expresses the quality of a cell placement.

FIG. 29 is a flow chart illustrating the flow of a processing of a pairwise interchange method. At a step a1, the cells are randomly placed to form an initial placement. At a step a2, there is calculated the value of a placement evaluation function in the initial placement. The value thus calculated is set to E0. The number of iteration times is set to 1.

At a step a3, two cells are randomly selected and replaced with each other. At a step a4, there is calculated the value of a placement evaluation function in the placement thus changed at the step a3. The value thus calculated is set to E1. At a step a5, when E0 is smaller than E1, the sequence proceeds to a step a6 where the cell placement is brought back to the original placement before changed at the step a3. Then, the sequence proceeds to a step a8. When E0 is not less than E1, the sequence proceeds to a step a7 where E1 is substituted for E0 and the number of iteration times is set to 1. Then, the sequence is returned to the step a3.

At the step a8, when the number of iteration times is not less than the designated number of times, the processing is finished. Otherwise, the sequence proceeds to a step a9 where 1 is added to the number of iteration times. Then, the sequence is returned to the step a3.

With the processing above-mentioned, there is obtained a cell layout in which the value of a placement evaluation function is minimized.

By a wiring processing S5, a detailed wiring design is made for the placed cell group, and a layout of cell interconnection is obtained.

By a mask pattern preparing processing S6, a mask pattern is prepared according to the layout of cells and cell interconnection. The mask pattern thus prepared, is to be used in a post-processing for a production of semiconductor.

FIG. 30 is an example of a design result obtained by a layout design method of prior art. Shown in FIG. 30 are a cell 100, a cell terminal 101, a first layer metallic wiring 201, a second layer metallic wiring 202, a contact 230 and pure wiring zones 240. Each pure wiring zone 240 refers to a zone disposed solely for the purpose of wiring where a cell 100 is not being disposed under the wiring. The arrangement in FIG. 30 is based on the assumption of a layout design by a so-called two-layer wiring in which only two wiring layers can be put one upon another.

When the two-layer wiring is premised, the number of wiring layers which can be utilized over the cell area, is limited since internal routing of cells is done using the first metal layer. In this connection, wiring is made only in the pure wiring zones 240 as shown in FIG. 30.

On the other hand, there have conventionally been achieved some layout design methods in each of which is based on the assumption of the use of a so-called multi-layer wiring technology that three or more wiring layers can be put one upon another.

FIG. 31 is an example of a design result obtained by a layout design method of prior art which is made based on the assumption of the use of a multi-layer wiring technology. Shown in FIG. 31 are a cell 100, a cell terminal 101, over-the-cell wiring zones 150, a first layer metallic wiring 201, a second layer metallic wiring 202, a third layer metallic wiring 203, a contact 230, a pure wiring zone 240, a first wiring zone 301, and a second wiring zone 302. Here, wiring in three or more layers can be made with the use of a multi-layer wiring technology. In three metal layer process, internal routing of cells is done using the first metal and polysilicon and the remaining two layers can optionally be utilized for wiring even on the cell 100. The first wiring zone 301 is formed by over-the-cell wiring zones 150 and the pure wiring zone 240, and the second wiring zone 302 is formed only by over-the-cell wiring zones 150.

The wiring layout as shown in FIG. 31 is designed as follows. After a detailed two-layer wiring has been made by the wiring processing S5 for example, multi-layer wiring is further allotted onto the already made two-layer wiring, and the layout is then compacted to generate a wiring form in a minimum wiring zone which satisfies the design specifications with the over-the-cell wiring zones 150 and the pure wiring zone 240 included therein.

All the wiring is made in the pure wiring zone 240 in FIG. 30, while the wiring is made both in the pure wiring zone 240 and the over-the-cell wiring zones 150 in FIG. 31. Accordingly, the pure wiring zone 240 in FIG. 31 is remarkably reduced in area as compared with that in FIG. 30. This results in reduction of the entire circuit block in area. Such a method of reducing the circuit block in area using the multi-layer wiring technology, has been reported in "Over-the-Cell Routers for New Cell Model" written by B. Wu et al (29-th ACM/IEEE Design Automation Conference, pp 604–607, 1992).

However, the following problems are encountered in the layout design method of prior art.

The area of a circuit block is the sum of the entire cell area and the pure wiring zone. Conventionally, an endeavor has been made for reducing the pure wiring zone in area by exerting ingenuity in wiring processing. As a result, the area of a pure wiring zone has now substantially been minimized. However, since the cell layout is fixed, the entire cell area cannot be further reduced. This makes it very difficult to further reduce the circuit block in area.

When a layout design is made based on the assumption of a multi-layer wiring technology, the pure wiring zone is further reduced as compared with a layout design based on the assumption of a two-layer wiring technology. As apparent from FIG. 31, however, there are instances where the pure wiring zone 240 is not always eliminated in a zone where wiring is concentrated, even though a multi-layer wiring technology is used. Accordingly, even though a multi-layer wiring technology is used, a prior art method has a limit in reduction of the circuit block in area.

To further reduce the pure wiring zone 240, there is required a layout design method which has a cell changing method of changing, in a zone where wiring is concentrated, each cell to a cell of which over-the-cell wiring zone 150 is great.

SUMMARY OF THE INVENTION

It is an object of the present invention to provide an LSI layout design method having, in order to reduce a circuit block in area, a cell changing processing capable of remarkably reducing the area of a pure wiring zone for cell interconnection, yet minimizing the influence upon the circuit characteristics.

To achieve the object above-mentioned, the present invention provides an LSI layout design method of designing, according to circuit design information, a layout of cells and cell interconnection on a semiconductor substrate and preparing a mask pattern based on the layout thus designed, and this LSI layout design method comprises: an input processing for entering circuit design information and the information of a cell group which can be placed; a cell placing processing for selecting cells from the cell group which can be placed, and for two-dimensionally placing the cells thus selected on a plane according to the circuit design information, thereby to design a layout of the selected cells arranged in a plurality of parallel cell rows; a wiring zone height estimating processing for estimating, in the cell layout designed by the cell placing processing, the wiring zone height or length in a direction at a right angle to the cell rows, of a necessary wiring zone required between two adjacent cell rows; a cell changing processing for amending the cell layout by changing a cell placed on the cell layout designed by the cell placing processing, to a cell which has the same specifications and a different shape or a different cell terminal position and which is contained in the cell group which can be placed, thereby to reduce the area of a pure wiring zone disposed solely for the purpose of wiring, the pure wiring zone being required for assuring the wiring zone height of the necessary wiring zone, in addition to the over-the-cell wiring zones where wiring can be made on cells; a wiring processing for designing a layout of cell interconnection according to the cell layout amended by the cell changing processing and according to the circuit design information; and a mask pattern preparing processing for preparing a mask pattern based on the layout of cells and cell interconnection designed by the processings above-mentioned.

According to the LSI layout design method above-mentioned, a cell once placed by the cell placing processing, is suitably changed, by the cell changing processing, to a cell which has the same specifications and a different shape or a different cell terminal position and which is contained in the cell group which can be placed. This considerably reduces the area of the pure wiring zone disposed solely for the purpose of wiring. Thus, there can be designed a layout remarkably reduced in circuit block area.

The cell changing processing may comprise: a cell row height determining processing for obtaining a cell row height such that the wiring zone height of the necessary wiring zone is assured in the over-the-cell wiring zones; a cell merge processing for (i) acquiring, from the information entered by the input processing relating to the cell group which can be placed, the figure information of placement and wiring of transistors of cells forming each cell row, (ii) merging a plurality of cells of one cell row or two adjacent cell rows, into one cell, and (iii) vertically or horizontally compacting the figure of placement and wiring of the transistors of the plurality of cells such that the height of each of the cell rows is equal to the cell row height obtained by the cell row height determining processing; and a processing for changing a plurality of cells out of the cells placed by the cell placing processing, to a cell obtained by the cell merge processing.

According to the LSI layout design method above-mentioned, there is determined, by the cell row height determining processing, a cell row height such that the resulting layout contains no pure wiring zone disposed solely for the purpose of wiring. By the cell merge processing, the figure of placement and wiring of the transistors of cells is compacted to minimize an increase in cell area with a change in cell row height. Thus, there can be designed a layout remarkably reduced in circuit block area.

BRIEF DESCRIPTION OF THE DRAWINGS

FIG. 1 is a flow chart illustrating a basic processing flow of an LSI layout design method according to the present invention;

FIG. 2(a) and (b) are plan views illustrating the schematic structures of two types of cell shapes, in which FIG. 2(a) shows an oblong cell shape and FIG. 2(b) shows a longwise cell shape;

FIG. 3 is a flow chart illustrating the flow of a cell changing processing according to a first embodiment of the present invention;

FIG. 5 is a layout view of the layout design result obtained by the first embodiment;

FIG. 6 is a flow chart illustrating the flow of a cell changing processing according to the first embodiment;

FIG. 7(a), (b) and (c) are plan views illustrating three types of cell terminal positions, in which FIG. 7(a) shows the cell terminals positioned at the center of the cell.

FIG. 8 is a flow chart illustrating the flow of a cell changing processing according to a second embodiment of the present invention;

FIG. 13 is a layout view of cells placed in the course of the cell changing processing according to the third embodiment;

FIG. 22 is a flow chart illustrating the flow of a cell merge processing according to a fifth embodiment of the present invention;

FIG. 23(a) and (b) are views illustrating the fifth embodiment, in which FIG. 23(a) is a layout view of the layout design result without the cell merge processing according to the fifth embodiment executed.

DETAILED DESCRIPTION OF THE INVENTION

The following description will discuss embodiments of the present invention with reference to the attached drawings.

(First Embodiment)

FIG. 1 is a flow chart illustrating a basic processing flow of method of and apparatus for designing an LSI layout according to the present invention.

By an input processing S1, cell interconnection data obtained by logic design and cell library data are entered and stored in a memory of a calculator. The first embodiment is characterized in that the cell library contains the information of a plurality of cells which have the same specifications and which have different shapes, respectively.

Conventionally, a large number of steps is required for cell design. However, the recent development of automatic cell synthesis technology makes it possible to form, in different shapes, cells having the same logic and the same transistor drive ability.

Figure 2A:
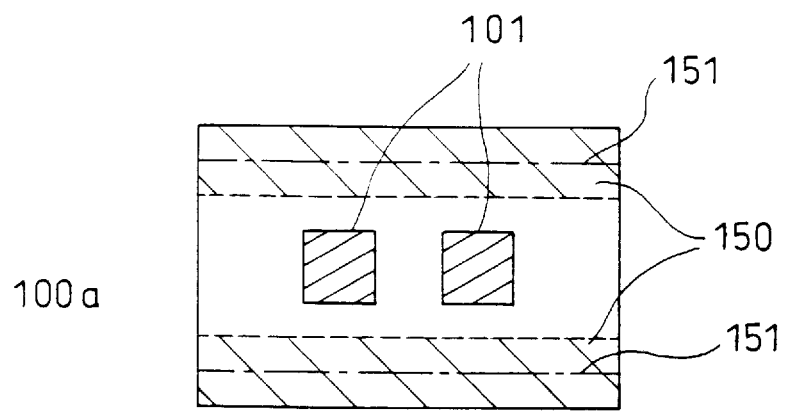
Figure 2B:
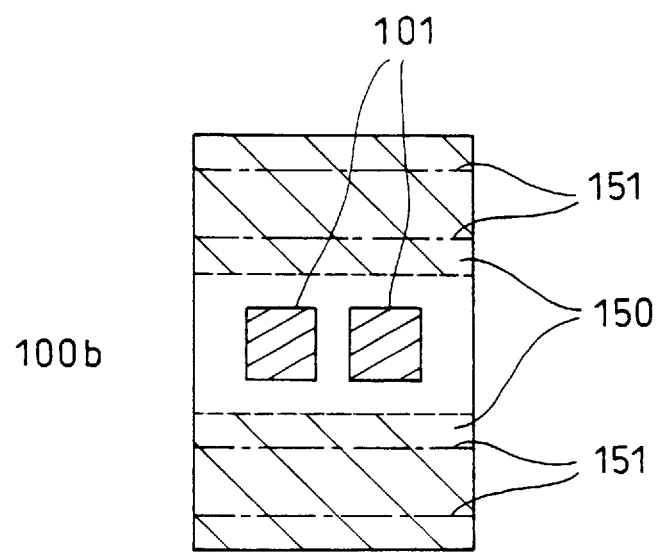

FIG. 2 shows the layout structures in plan elevation of two types of cell shapes 100a, 100b. Shown in FIG. 2 are cell terminals 101, over-the-cell wiring zones 150 and virtual wiring lines 151 indicating the horizontal wiring lines which could be installed on the over-the-cell wiring zones 150. The cell shape 10a is oblong and the cell shape 100b is longwise. When the pitch between wiring lines on the same layer is set to $w_0$, the number of wiring lines which can transversely be placed in parallel with one another on the over-the-cell wiring zones 150, is called a wiring height of the cell shape. In FIG. 2, the wiring height of the cell shape 100a is 2, while the wiring height of the cell shape 100b is 4.

The cells having the same specifications substantially have the same area with slight differences in area because of changes in transistor wiring figure with changes in cell shape. In FIG. 2, it is now supposed that the cell shape 100a is formed in a minimum area for the logic circuit specifications and that the cell shape 100b is greater in area by a fine amount δ than the cell shape 100a.

According to the first embodiment, it is now supposed that the two cell shapes shown in FIG. 2 can be utilized.

By a cell placement processing S2, cells are selected from the cell library and placed on a plane to design a layout of the cells arranged in a plurality of cell rows. Likewise in a method of prior art, the cell placement processing S2 is executed by a pairwise interchange method or the like. In the first embodiment, there is selected, as the cell shape, the cell shape 100a of which area is the smallest.

The following description will discuss a placement evaluation function used at the cell placement processing S2.

To design a highly efficient LSI, it is required to minimize the wiring length to minimize a signal delay. Accordingly, as a placement evaluation function, there is used an equation for presuming the wiring length from the cell positions and the net list.

Generally, concentrated wiring makes the wiring operation difficult and inevitably increases the area of the necessary wiring zone. It is therefore required to avoid concentrated wiring as much as possible. Thus, an equation representing the degree of wiring concentration is used as a placement evaluation function. More specifically, virtual grid lines are disposed in wiring zones between adjacent cell rows, there are obtained the numbers of wiring lines which pass through the grid zones surrounded by the grid lines, and the sum of the squares of the numbers thus obtained is calculated.

As a specific example, the placement evaluation function is set forth below:

$$C(\phi) = \Sigma_1 \Sigma_2 \{|X(i) - X(j)| + |Y(i) - Y(j)|\} + \Sigma_3 \{dens(p)\}^2 \qquad (1)$$

wherein $X(i)$, $Y(i)$ are the coordinates of the ith cell; $|X(i)-X(j)|+|Y(i)-Y(j)|$ refers to an approximate value of the distance between the ith cell and the jth cell; $\Sigma_2$ means to obtain the total sum of the distances between cells i, j which are described on the net list and which have terminals to be connected by the same wiring line; and $\Sigma_1$ means to obtain the total sum of $\Sigma_2$ for all the cells i on the net list. More specifically, the first term is an equation for presuming the wiring length. In the equation (1), dens(p) means the number of wiring lines which pass through a grid point p, and $\Sigma_3$ means to obtain the sum of the squares of the numbers of the wiring lines which pass through all the grid points. That is, the second term is an equation representing the degree of wiring concentration. In the equation (1), $\phi$ is a variable representing a placement circumstance.

With the use of such a placement evaluation function, the cell placement processing S2 is executed by a pairwise interchange method discussed in connection with the prior art, or the like.

Then, there is executed a processing S3 for estimating the height of a wiring zone. According to the estimation processing S3, there is obtained, in the cell layout designed by the cell placement processing S2, the number of wiring lines required to be installed between adjacent cell rows and in parallel with the cell rows (hereinafter referred to as the number of passing wiring lines), and there is estimated, based on the number of passing wiring lines thus obtained, the height or length of a necessary wiring zone in a direction at a right angle to the cell rows.

When the pitch between adjacent wiring lines on the same layer is set to $w_0$, the height $h(i)$ of the ith wiring zone is obtained according to the following equation:

$$h(i) = w_0 \times n(i) \qquad (2)$$

wherein $n(i)$ is the number of passing wiring lines in the ith wiring zone. The number of passing wiring lines $n(i)$ may be obtained by actually finishing detailed routing on a cell placement, or by calculating with the use of dens(p) in the equation (1). In the first embodiment, it is supposed that $w_0$ is equal to 1 and that the wiring zone height $h(i)$ is equal to the number of passing wiring lines $n(i)$. Here, the wiring zone height $h(i)$ corresponds to the wiring height of a cell shape discussed earlier.

Then, a cell changing processing S4 is executed. The cell changing processing S4 comprises two processings as shown in FIG. 3.

First, there is executed a processing S41a for obtaining the maximum value H of wiring zone height. The processing S41a can readily be achieved by the following equation:

$$H = \text{MAX}(h(i)) \qquad (3)$$

(i=1,2 . . . , the number of wiring zones)
wherein MAX () is a function for obtaining the maximum value out of given numerical values.

Figure 4:
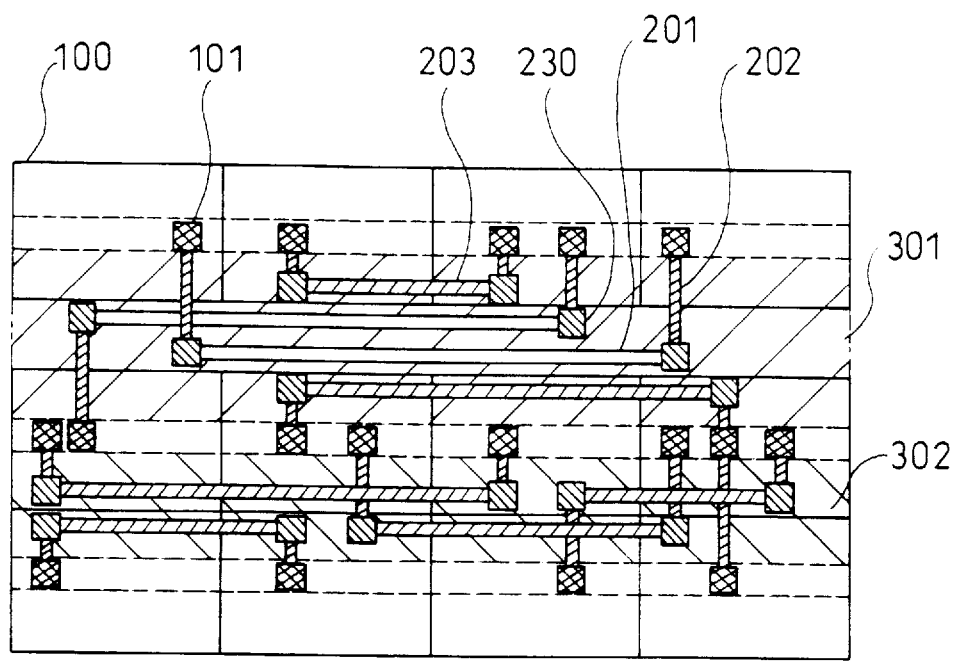
FIG. 4 is a layout view of the layout design result obtained by a prior art method.

Then, a processing S41b is executed. There is now considered a case where a layout as shown in FIG. 4 is obtained in a layout design method of prior art. Shown in FIG. 4 are a cell 100, a cell terminal 101, a first layer metallic wiring 201, a second layer metallic wiring 202, a third layer metallic wiring 203, a contact 230, a first wiring zone 301 and a second wiring zone 302. As the cell 100, the cell shape 100a is used.

According to this processing, each of all the cells is changed to a cell of which specifications are the same and which has a shape such that the wiring height Hc satisfies the following formula:

$$Hc \geq H \qquad (4)$$

In the layout shown in FIG. 4, the number of passing wiring lines in the first wiring zone 301 is equal to 4, and the number of passing wiring lines in the second wiring zone 302 is equal to 2. Accordingly, the following equations are established:

$$n(1)=4, n(2)=2$$

Then, the following equations are established from the equations (2), (3) and (4):

$$h(1)=1\times4=4, h(2)=1\times2=2$$

$$\therefore H = \text{Max}\{h(1), H(2)\}=4$$

$$\therefore Hc \geq 4$$

This means that each of the cells may be changed to a cell having a cell shape in which the wiring height Hc is 4 or more. Since the wiring height of the cell shape 100b shown in FIG. 2, is equal to 4, the shapes of all the cells are changed to the cell shape 100b.

Then, by a wiring processing S5, a detailed wiring design is made based on the assumption of a multi-layer wiring technology likewise in a prior art method.

Finally, by a mask pattern preparing processing S6, a mask pattern is prepared according to the layout of cells and cell interconnection.

FIG. 5 is an example of the design result obtained by a layout design method according to the first embodiment of the present invention. Shown in FIG. 5 are a cell 100, a cell terminal 101, a second layer metallic wiring 202, a third layer metallic wiring 203 and a contact 230. When comparing the layout in FIG. 5 with that in FIG. 4, it is apparent that a pure wiring zone is eliminated by changing the shape of the cell 100 to the cell shape 100b.

By changing the shape of the cell 100 from the cell shape 100a to the cell shape 100b, each cell is increased by $\delta$ in area. However, since $\delta$ is very small, the entire cell area is not substantially increased. Thus, the elimination of a pure wiring zone remarkably reduces the circuit block in area.

Further, even though the cell library does not contain a cell which has a shape satisfying the equation (4), the pure wiring zone can be reduced in area by changing each of the cells to a cell having the maximum wiring height out of a cell group having the same specifications.

Further, all the cell rows are similarly increased or decreased in length, thus all cell row lengths are almost even. This prevents the circuit block from being increased in area due to a vacant zone resulting from variations of cell row length.

Further, even though a cell changing processing S4 as shown in FIG. 6 is executed, there are also produced effects similar to those above-mentioned. At a processing S41c, there are obtained the heights $h_u(i)$, $h_d(i)$ of two wiring zones which sandwich each cell row. At a processing S41d, each of the cells forming each cell row, is changed to a cell having a wiring height not less than the average $H_M$ of $h_u(i)$ and $h_d(i)$.

In the first embodiment, it is supposed that there are two different types of cell shapes. However, the present invention is not limited to such an arrangement. Further, the cell changing processing S4 may be executed using cells of which shapes are automatically changed. Such an arrangement also produces effects equivalent to or more than those produced in the embodiment above-mentioned.

(Second Embodiment)

In a second embodiment of the present invention, the basic processing flow is the same as that in the first embodiment, and therefore follows the flow chart shown in FIG. 1.

An input processing S1 is executed in a manner similar to that in the first embodiment. The second embodiment is characterized in that the cell library contains the information of a plurality of cells of which specifications and shapes are the same as one another, but of which cell terminal positions are different from one another.

Figure 7A:
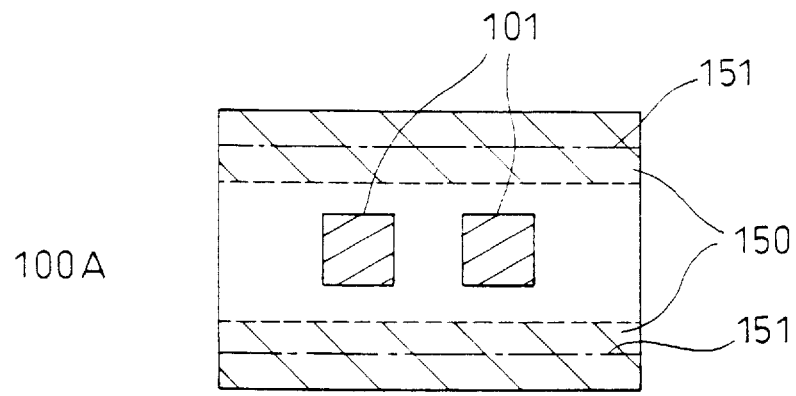
Figure 7B:
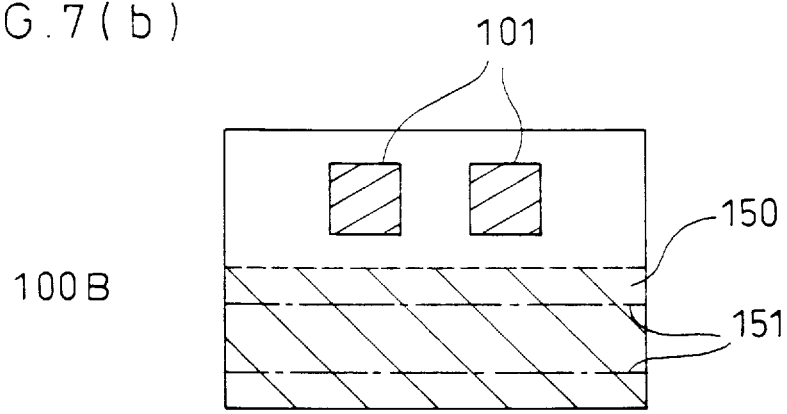
FIG. 7(b) shows the cell terminals positioned at an upper portion of the cell.
Figure 7C:
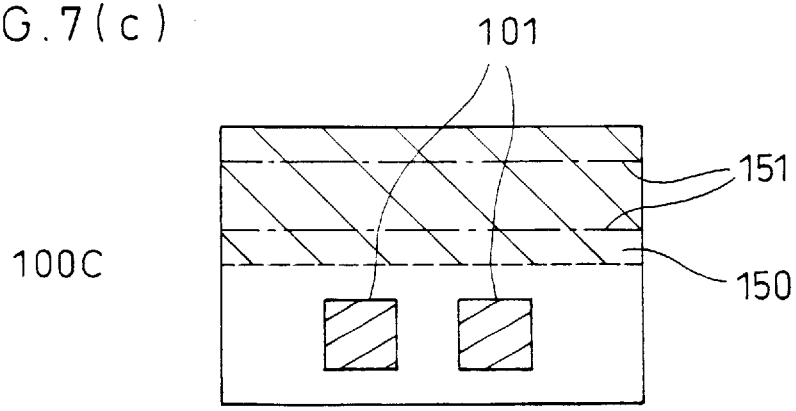
FIG. 7(c) shows the cell terminals positioned at a lower portion of the cell.

FIG. 7(a), (b) and (c) show the layout structures in plan elevation of three different types of cell terminal position 100A, 100B, 100C. Shown in FIG. 7 are cell terminals 101, over-the-cell wiring zones 150 and virtual wiring lines 151 indicating the wiring lines which could be installed on the over-the-cell wiring zones 150. In each of FIG. 7(a), (b), (c), the cell wiring height is 2. In the cell terminal position 100A, the cell terminals 101 are positioned to divide the over-the-cell wiring zone at 1:1. In the cell terminal position 100B, the cell terminals 101 are positioned to divide the over-the-cell wiring zone at 0:2. In the cell terminal position 100C, the cell terminals 101 are positioned to divide the over-the-cell wiring zone at 2:0. In the second embodiment, it is supposed that three different cell terminal positions as shown in FIG. 7 can be utilized.

Each of a cell placement processing S2 and a wiring zone height estimation processing S3 is executed in a manner similar to that in the first embodiment.

Then, a cell changing processing S4 is to be executed. As shown in FIG. 8, the cell changing processing S4 is achieved by executing two processings for each cell row.

Figure 9:
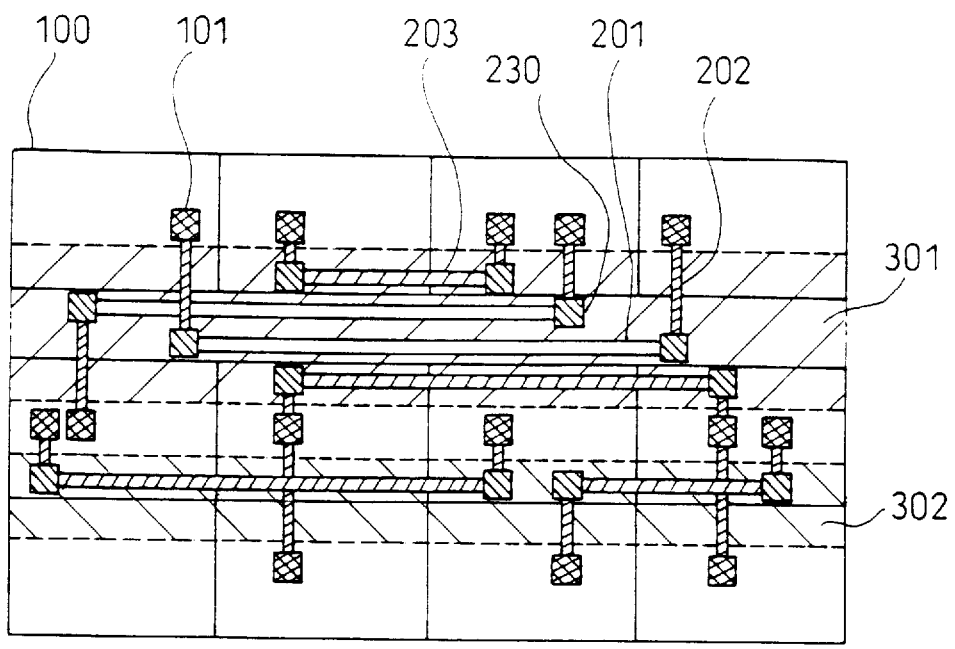
FIG. 9 is a layout view of the layout design result obtained by a prior art method.

Now, there is considered the case where a layout as shown in FIG. 9 is obtained by a layout design method of prior art. Shown in FIG. 9 are a cell 100, a cell terminal 101, a first layer metallic wiring 201, a second layer metallic wiring 202, a third layer metallic wiring 203, a contact 230, a first wiring zone 301 and a second wiring zone 302. In the cell 100, there is used the cell terminal position 100A in FIG. 7.

At a processing S42a, there are taken out, from the wiring zone heights already obtained at the wiring zone height estimation processing S3, the wiring zone heights $h_u(i)$, $h_d(i)$ of two wiring zones which sandwich the ith cell row. In FIG. 9, attention is now placed on the center or second cell row. Since the height of the first wiring zone 301 is 4 and the height of the second wiring zone 302 is 1, the following equations are established:

$$h_u(2)=4, h_d(2)=1$$

By a processing S42b, each cell is changed to a cell in which the cell terminals 101 are positioned such that the over-the-cell wiring zone 150 is divided at $h_u(i):h_d(i)$.

Since $h_u(2):h_d(2)=4:1$, each of the cells of the second cell row is changed to a cell in which the cell terminals 101 are positioned such that the over-the-cell wiring zone 150 is divided at 4:1. Now, the cell library contains no cell in which the cell terminals 101 are positioned such that the over-the-cell wiring zone 150 is divided at 4:1. Accordingly, provision is made such that the most suitable cell is selected from the three types of cells of which cell terminal positions are different from one another. In this case, the cell having the cell terminal position 100C is selected, and each cell on the second cell row is changed to the cell having the cell terminal position 100C.

Each of a wiring processing S5 and an mask pattern preparing processing S6 is executed in a manner similar to that in the first embodiment.

Figure 10:
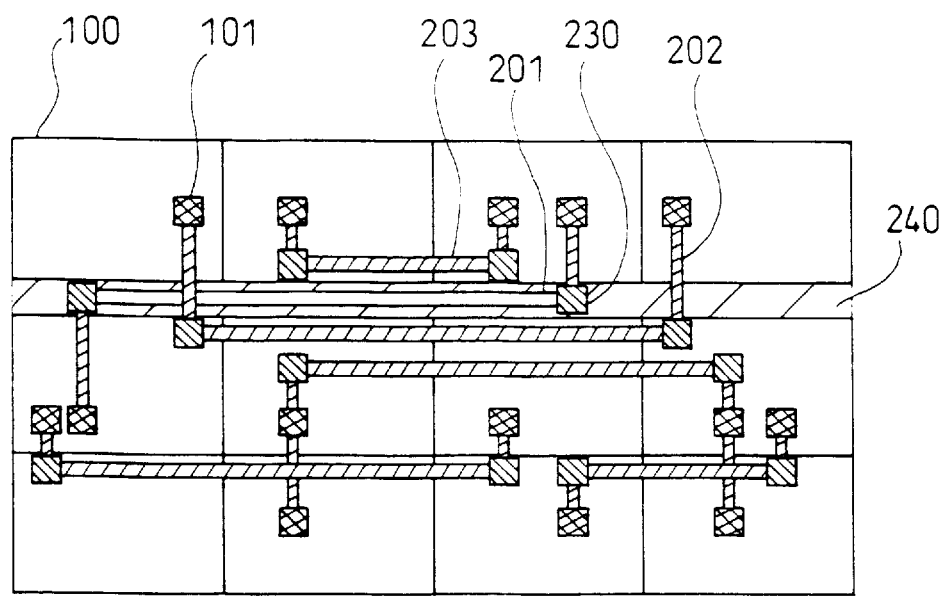
FIG. 10 is a layout view of the layout design result obtained by the second embodiment.

FIG. 10 is an example of the design result obtained by the layout design method according to the second embodiment.

Shown in FIG. 10 are a cell 100, a cell terminal 101, a first layer metallic wiring 201, a second layer metallic wiring 202, a third layer metallic wiring 203, a contact 230 and a pure wiring zone 240. It is understood that the area of the pure wiring zone is smaller in FIG. 10 than in FIG. 9 by changing each cell 100 on the second cell row to a cell of which terminal positions are different from those in each cell 100.

In the second embodiment, there are provided three different types of cell terminal positions. However, there may be provided four or more different types of cell terminal positions, or provision may be made such that the terminal positions are changed by parameters. Such an arrangement also produces effects equivalent to or more than those produced by the second embodiment.

(Third Embodiment)

In a third embodiment of the present invention, the basic processing flow is the same as that in each of the first and second embodiments, and therefore follows the flow chart shown in FIG. 1.

An input processing S1 is executed in a manner similar to that in each of the first and second embodiments. In the third embodiment, the cell library contains (i) the information of a plurality of cells of which specifications are the same as one another, but of which shapes are different from one another, and (ii) the information of a plurality of cells of which specifications and shapes are the same as one another, but of which cell terminal positions are different from one another.

A cell placement processing S2 is executed in a manner similar to that in the first embodiment. However, the following equation is used as a placement evaluation function.

$$Z(\phi) = \Sigma_1 \Sigma_2 \{|X(i) - X(j)| + |Y(i) - Y(j)|\} + \quad (5)$$
$$\Sigma_3 \{dens(p)\}^2 +$$
$$\Sigma_4 \{S_S(i)/[h_u(i) + h_d(i)]/2\}^2$$

wherein $X(i)$, $Y(i)$ are the coordinates of the ith cell; $dens(p)$ means the number of wiring lines which pass through a grid point p; $S_s(i)$ is the area of the ith cell row; and $h_u(i)$ and $h_d(i)$ are the heights of wiring zones required on and below the ith cell row, respectively.

In the placement evaluation function above-mentioned, the first and second terms are the same as those in the placement evaluation function represented by the equation (1) in the first embodiment, and represent the wiring length and the degree of wiring concentration, respectively. In the third term, $\Sigma_4$ means to obtain the total sum of the squares of the lengths of all the cell rows. More specifically, the third term represents the degree of variations of the cell row lengths. The inclusion of the third term in the placement evaluation function, can minimize the variations of cell row lengths in the cell placement processing S2.

Figure 11:
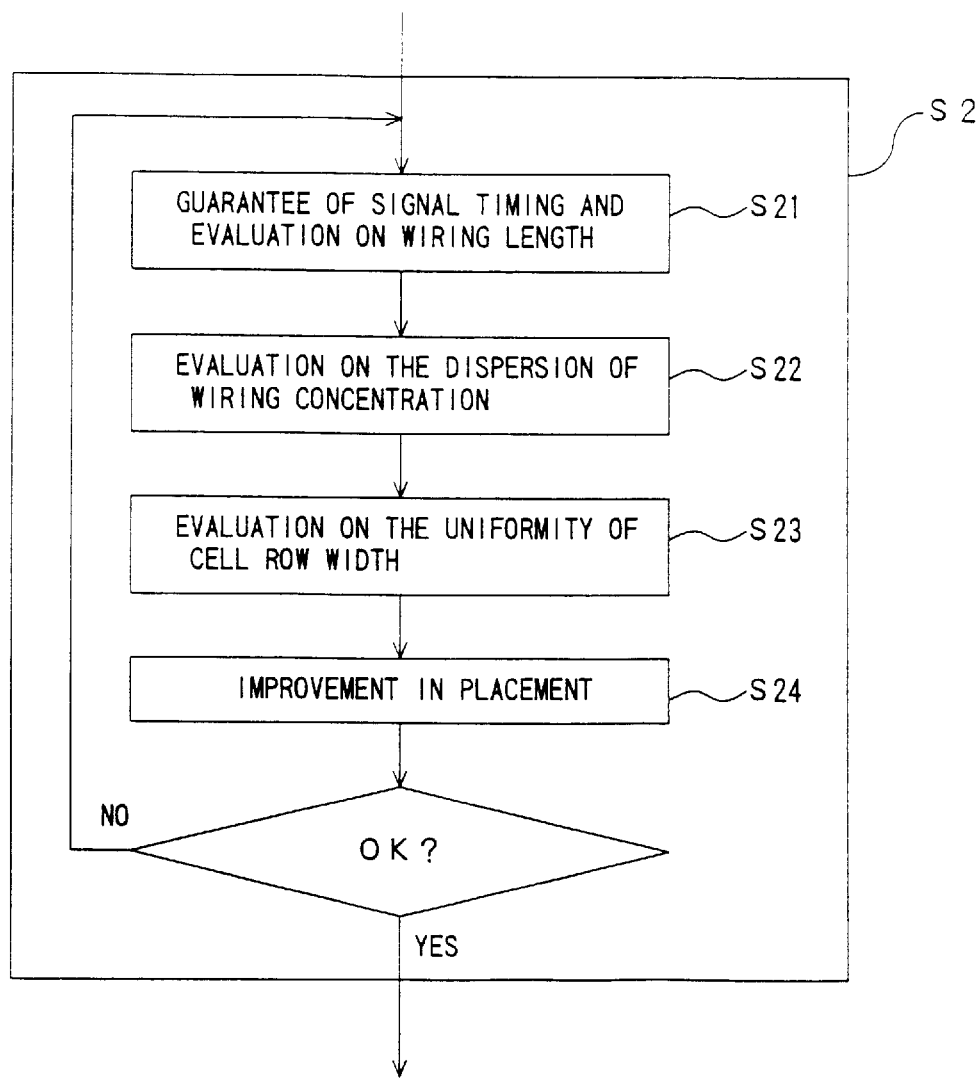
FIG. 11 is a flow chart illustrating the flow of a cell placing processing according to a third embodiment of the present invention.

FIG. 11 shows the flow of a cell placement processing S2 where the equation (5) is used as the placement evaluation function. The first term in the equation (5) corresponds to a processing S21, the second term corresponds to a processing S22, and the third term corresponds to a processing S23. A processing S24 is arranged to improve the cell placement such that the value of the equation (5) is made smaller.

A wiring zone height estimating processing S3 is executed in a manner similar to that in the first embodiment.

Figure 12:
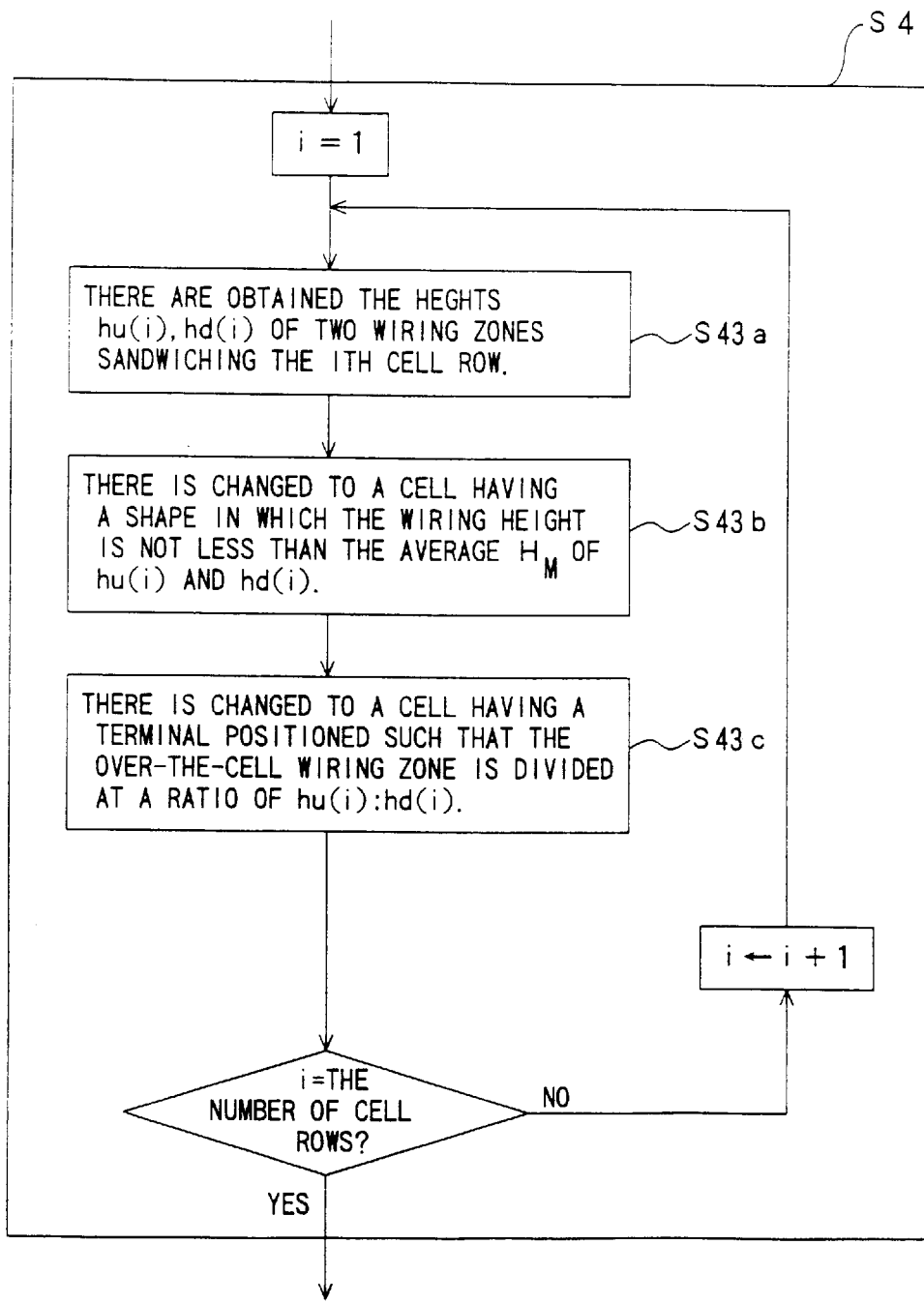
FIG. 12 is a flow chart illustrating the flow of a cell changing processing according to a third embodiment of the present invention.

Then, a cell changing processing S4 is executed. The cell changing processing S4 is achieved by executing three processings for each cell row, as shown in FIG. 12.

At a processing S43a, there are taken out, from the wiring zone heights already obtained at the wiring zone height estimation processing S3, the wiring zone heights $h_u(i)$, $h_d(i)$ of the wiring zones required on and below the ith cell row.

At a processing S43b, each cell on the ith cell row is changed to a cell of which wiring height is not less than the average value $H_M$ of $h_u(i)$ and $h_d(i)$. FIG. 13 shows the cell layout at the time the processing S43b is finished. Shown in FIG. 13 are a cell 100, a cell terminal 101, virtual wiring lines 151 indicating the wiring lines which could be installed on the over-the-cell wiring zones, and virtual wiring lines 241 indicating the wiring lines required on the pure wiring zones. Now, attention is placed on the center or second cell row. Since the following equations are established, the cell wiring height of the center cell row is required to be not less than 4:

$$h_u(2)=5, h_d(2)=2$$

$$\to H_M=3.5$$

Figure 14:
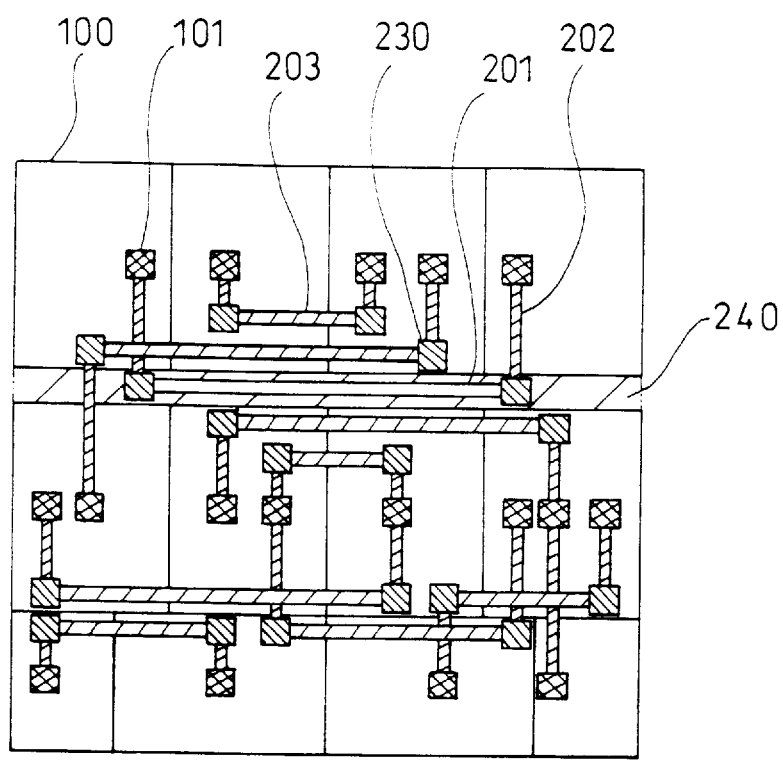
FIG. 14 is a layout view of the layout design result obtained by executing a wiring processing on the cell placement in FIG. 13.

When it is supposed that wiring is made at this stage, the result will be as shown in FIG. 14. Shown in FIG. 14 are a cell 100, a cell terminal 101, a first layer metallic wiring 201, a second layer metallic wiring 202, a third layer metallic wiring 203, a contact 230, and a pure wiring zone 240. From FIG. 14, it is understood that the pure wiring zone 240 remains in a very small area.

Figure 15:
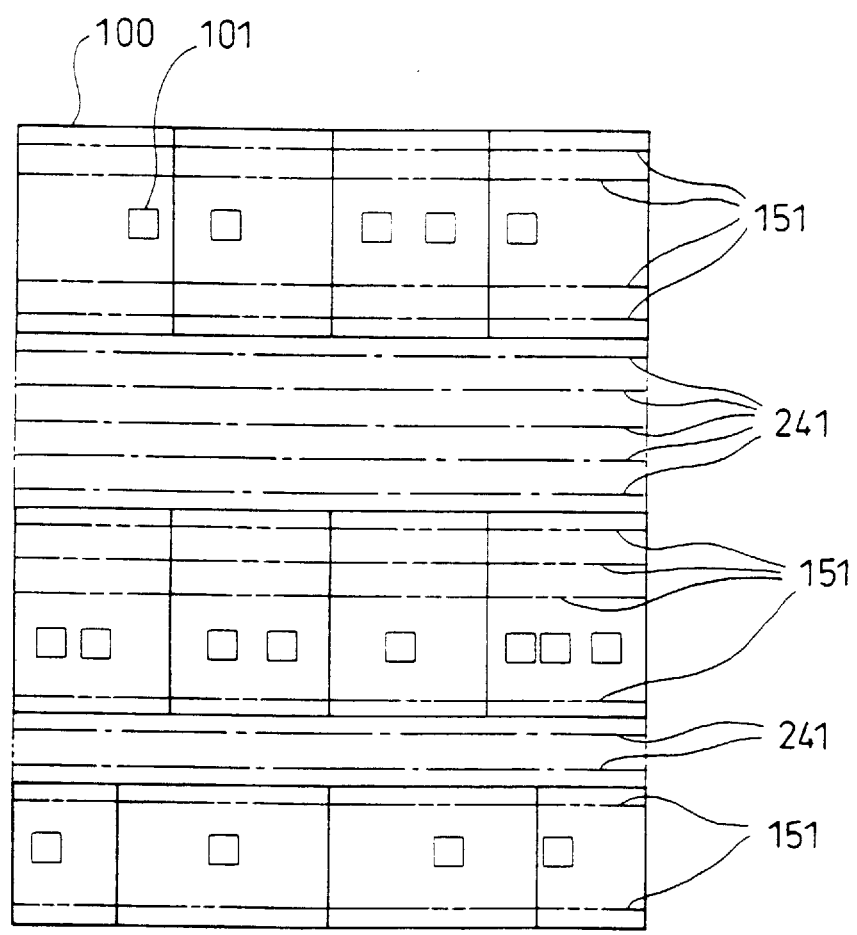
FIG. 15 is a layout view of the cell placement at the end of the cell changing processing according to the third embodiment.

At a processing S43c, each cell on the ith cell row is changed to a cell in which the cell terminals 101 are positioned such that the over-the-cell wiring zone is divided at $h_u(i):h_d(i)$. FIG. 15 shows the cell layout at the time the processing S43c is finished. Shown in FIG. 15 are a cell 100, a cell terminal 101, virtual wiring lines 151 indicating the wiring lines which could be installed on the over-the-cell wiring zones 150, and virtual wiring lines 241 indicating the wiring lines required on the pure wiring zone. Now, attention is placed on the center or second cell row. Since the cell wiring height of the center cell row is equal to 4, the following equations are established:

$$\begin{aligned} h_u(2):h_d(2) &= 5:2 \\ &= 4 \times 5/(5+2):4 \times 2/(5+2) \\ &= 2.86:1.14 \end{aligned}$$

Accordingly, each cell on the center cell row is changed to a cell having cell terminals 101 positioned such that the over-the-cell wiring zone is divided at 3:1.

The variations of cell row lengths have already been minimized using the placement evaluation function represented by the equation (5) at the cell placement processing S2. Accordingly, even though the cell rows undergo some change in length, the area is substantially not increased due to the occurrence of a vacant zone resulting from such change.

Further, cells are changed only when the average of the heights of the wiring zones required on and below a cell row, is greater than the height of the over-the-cell wiring zone. It is therefore possible to minimize an increase in over-the-cell feedthrough-wiring length or an increase in cell area due to a change in cell shape.

Each of a wiring processing S5 and a mask pattern preparing processing S6 is executed in a manner similar to that in the first embodiment.

Figure 16:
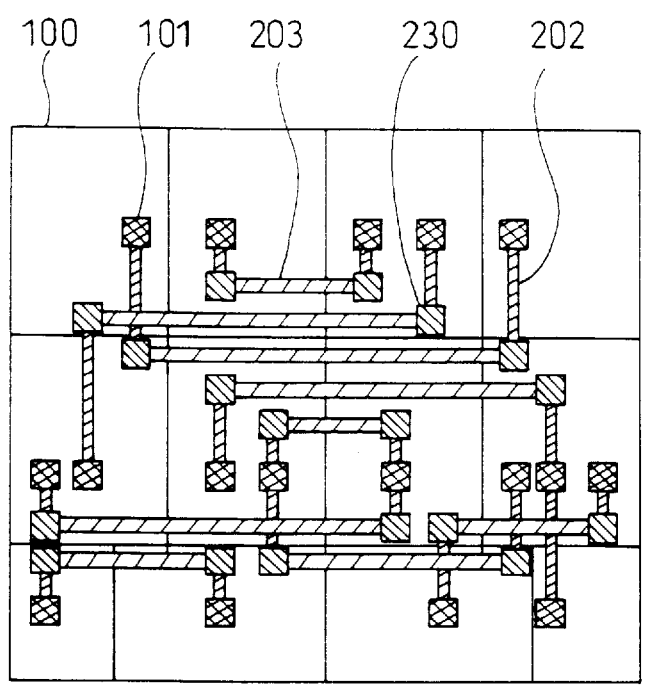
FIG. 16 is a layout view of the layout design result obtained by the third embodiment.

FIG. 16 is an example of the design result obtained by a layout design method according to the third embodiment. Shown in FIG. 16 are a cell 100, a cell terminal 101, a second layer metallic wiring 202, a third layer metallic wiring 203, and a contact 230. It is understood that the pure wiring zone 240 in FIG. 14 is eliminated in FIG. 16.

According to the third embodiment, even though the terminal positions or shapes are changed by parameters, similar effects may also be produced.

According to the third embodiment, the cell placement processing S2, the wiring zone height estimation processing S3 and the wiring processing S5 are independently executed. However, even though these processings S2, S3, S5 are simultaneously executed, similar effects may also be produced. The cell placement technology and wiring technology used in the third embodiment, are mere illustrative examples. Even though other cell placement technology and other wiring technology are used, similar effects may also be produced.

(Fourth Embodiment)

In a fourth embodiment of the present invention, the basic processing flow is the same as that in each of the first to third embodiments and therefore follows the flow chart shown in FIG. 1.

An input processing Si is executed in a manner similar to that in each of the first to third embodiments. Each of a cell placement processing S2 and a wiring zone height estimation processing S3 is executed in a manner similar to that in the first embodiment.

Figure 17:
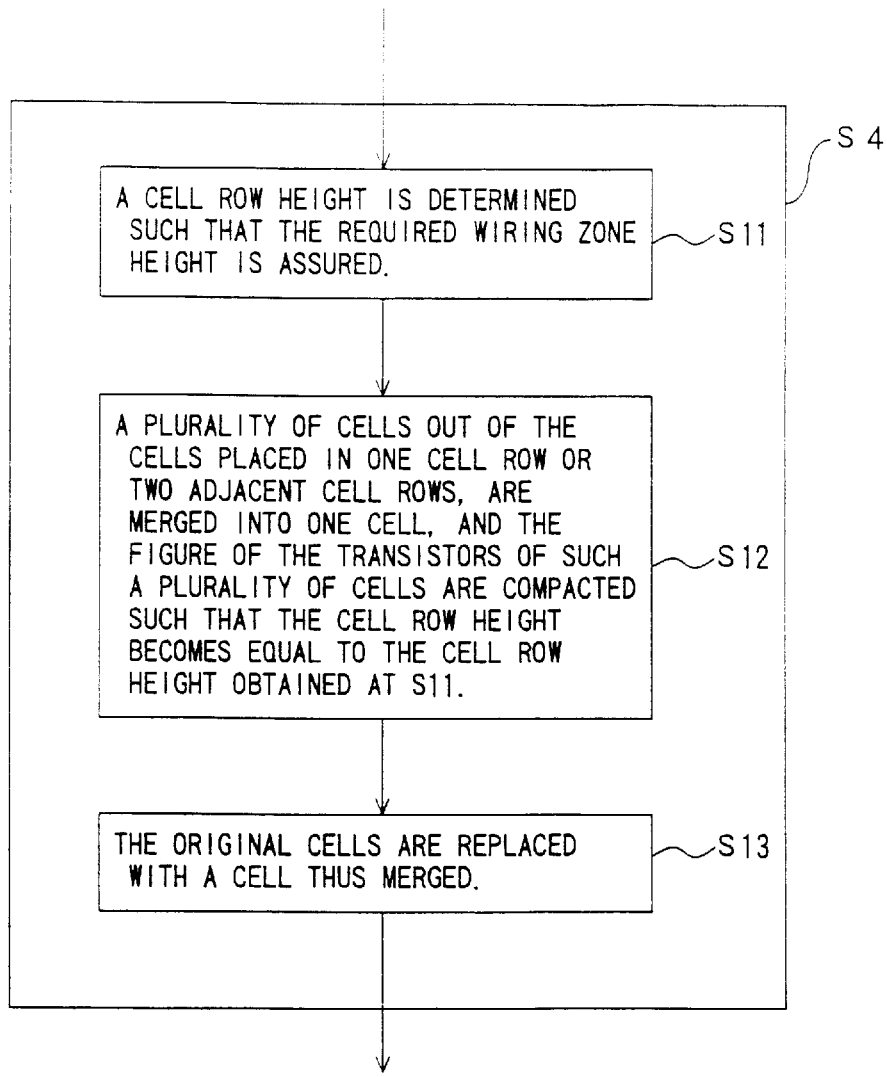
FIG. 17 is a flow chart illustrating the flow of a cell changing processing according to a fourth embodiment of the present invention.

Then, a cell changing processing S4 is to be executed. FIG. 17 is a flow chart illustrating the flow of the cell changing processing S4 according to the fourth embodiment.

As shown in FIG. 17, at a processing S11, there is determined such a cell row height as to assure the necessary wiring zone height in each zone where wiring can be made on a cell row (cell row height determining processing). Then, at a processing S12, there are acquired, from the cell information entered at the input processing S1, the figure information of placement and wiring of transistors for the cells of one cell row or two adjacent cell rows. Then, a plurality of cells out of the cells above-mentioned are vertically or horizontally compacted into one cell such that each cell row height is equal to the height determined at the cell row height determining processing S11 (cell merge processing). Then, all the cells placed at the cell placement processing S2 are changed to merged cells obtained by the cell merge processing S12.

Figure 18:
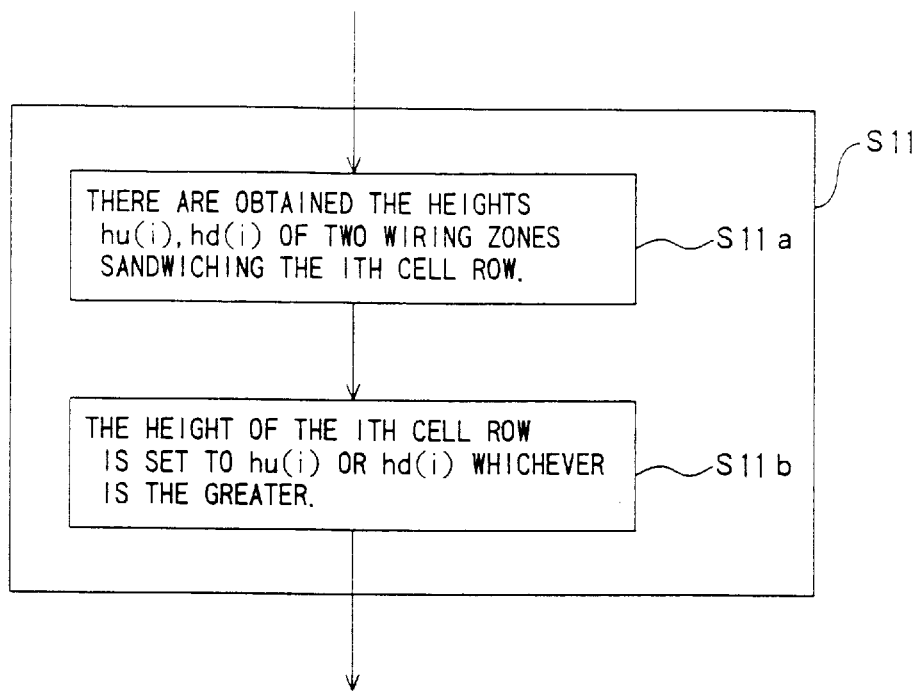
FIG. 18 is a flow chart illustrating the flow of a cell row height determining processing according to the fourth embodiment.

FIG. 18 shows a flow chart illustrating the flow of the cell row height determining processing S11. As shown in FIG. 18, at a processing S11a, there are obtained the heights $h_u(i)$ and $h_d(i)$ of two wiring zones which sandwich the ith cell row. Since the wring zone heights $h_u(i)$ and $h_d(i)$ have already been obtained at the wiring zone height estimation processing S3, such values are used. At a processing S11b, the height of the ith cell row is set to $h_u(i)$ or $h_d(i)$ whichever is the greater. In the fourth embodiment, such setting to the greater value is a mere example for providing such a cell row height as to securely execute the cell merge processing S12. It is noted that the fourth embodiment is not limited to the foregoing. For example, the average of $h_u(i)$ and $h_d(i)$ may be set.

Figure 19:
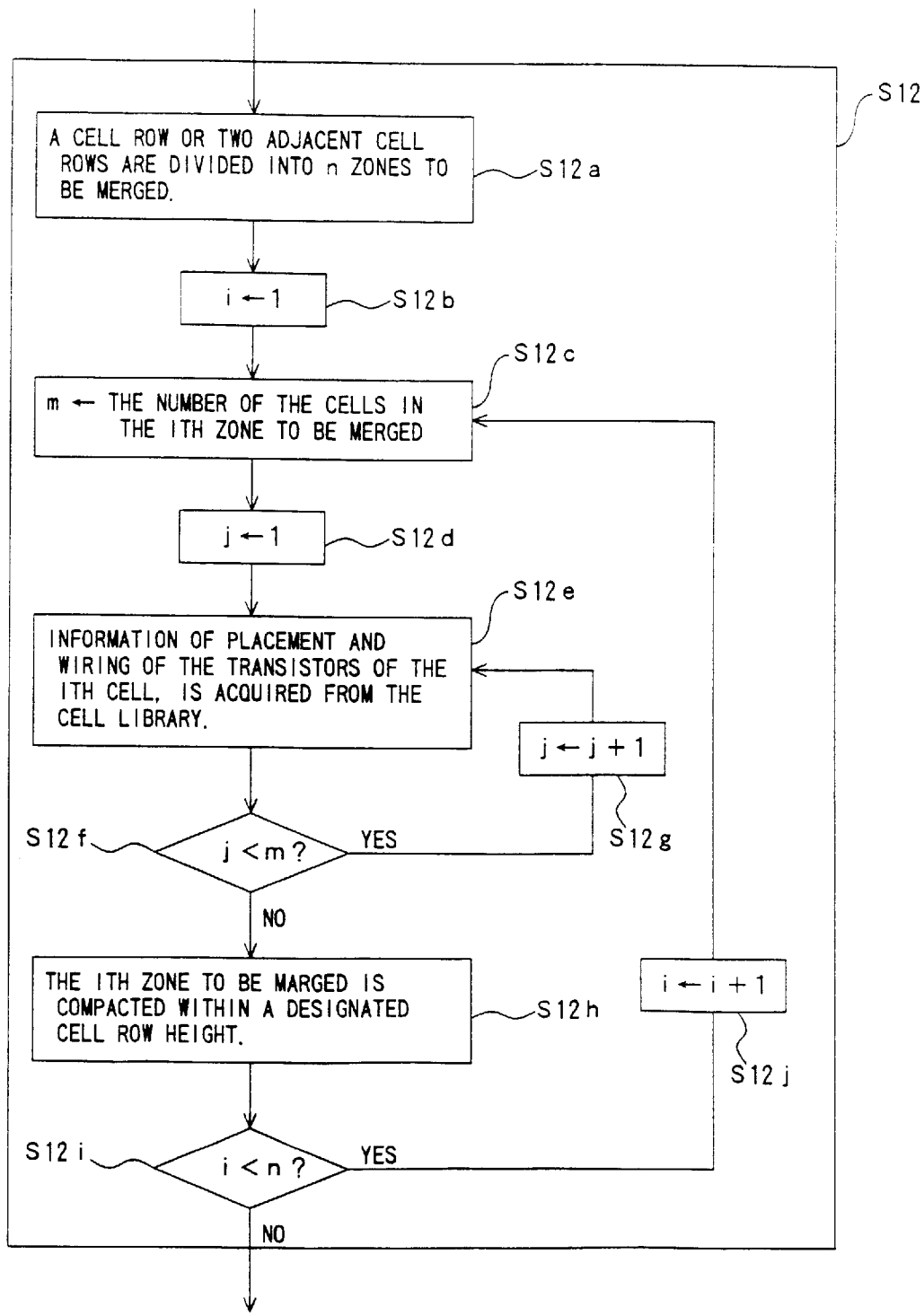
FIG. 19 is a flow chart illustrating the flow of a cell merge processing according to the fourth embodiment.

FIG. 19 is a flow chart of the cell merge processing S12. At a processing S12a, one cell row or two adjacent cell rows are divided into n zones to be merged (zones-to-be-merged dividing processing). At a processing S12b, 1 is set to i. Then, at a processing S12c, the number of cells belonging to the ith zone to be merged, is set to m. At a processing S12d, 1 is set to j. At a processing S12e, there is acquired, from the cell library information obtained at the input processing S1, the information of placement and wiring of the transistors of a cell j contained in the ith zone to be merged. At a processing S12f, it is judged whether or not j is smaller than m. When j is smaller than m, 1 is added to j at a processing S12g, and the processing S12e is again executed. When j is not smaller than m, the sequence proceeds to a processing S12h. That is, the processing S12e is repeatedly executed for all the cells contained in the ith zone to be merged.

At a processing S12h, the figure of placement and wiring of the transistors in the ith zone to be merged, is vertically or horizontally compacted within the range of the cell row height obtained at the cell row height determining processing S11. Such compaction may be made by a conventional method such as a method discussed in [Hyunchul Shin, Alberto L. Sangiovanni-Vincentelli, Carlo H, "Two-Dimensional Compaction by 'Zone Refining']. At a processing S12i, it is judged whether or not i is smaller than n. When i is smaller than n, 1 is added to i at a processing S12j and the sequence is returned to the processing S12c. When i is not smaller than n, the processing is finished. That is, cell merge is conducted on all n zones to be merged.

Figure 20:
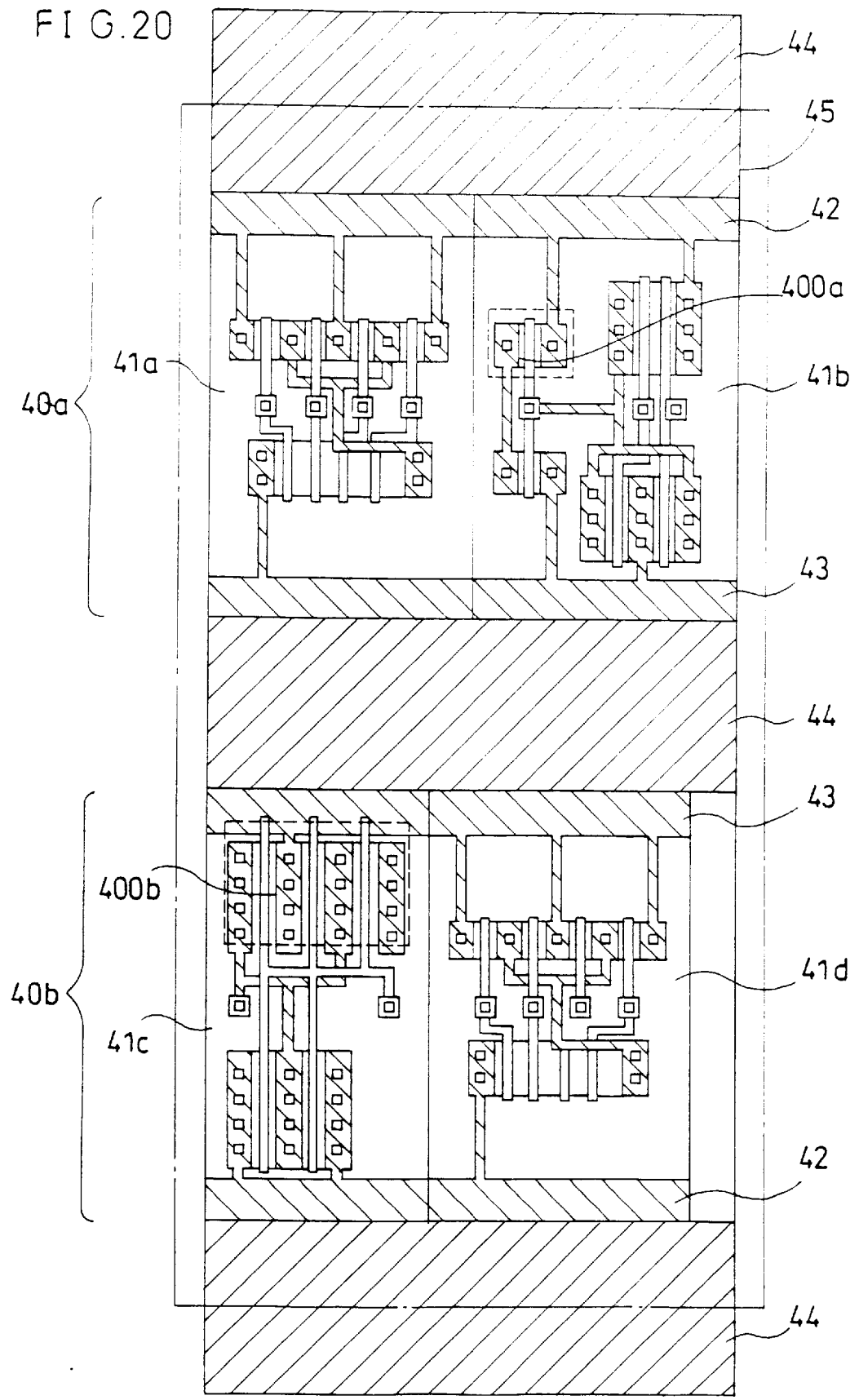
FIG. 20 is a layout view of the layout design result obtained without the cell merge processing according to the fourth embodiment executed.
Figure 21:
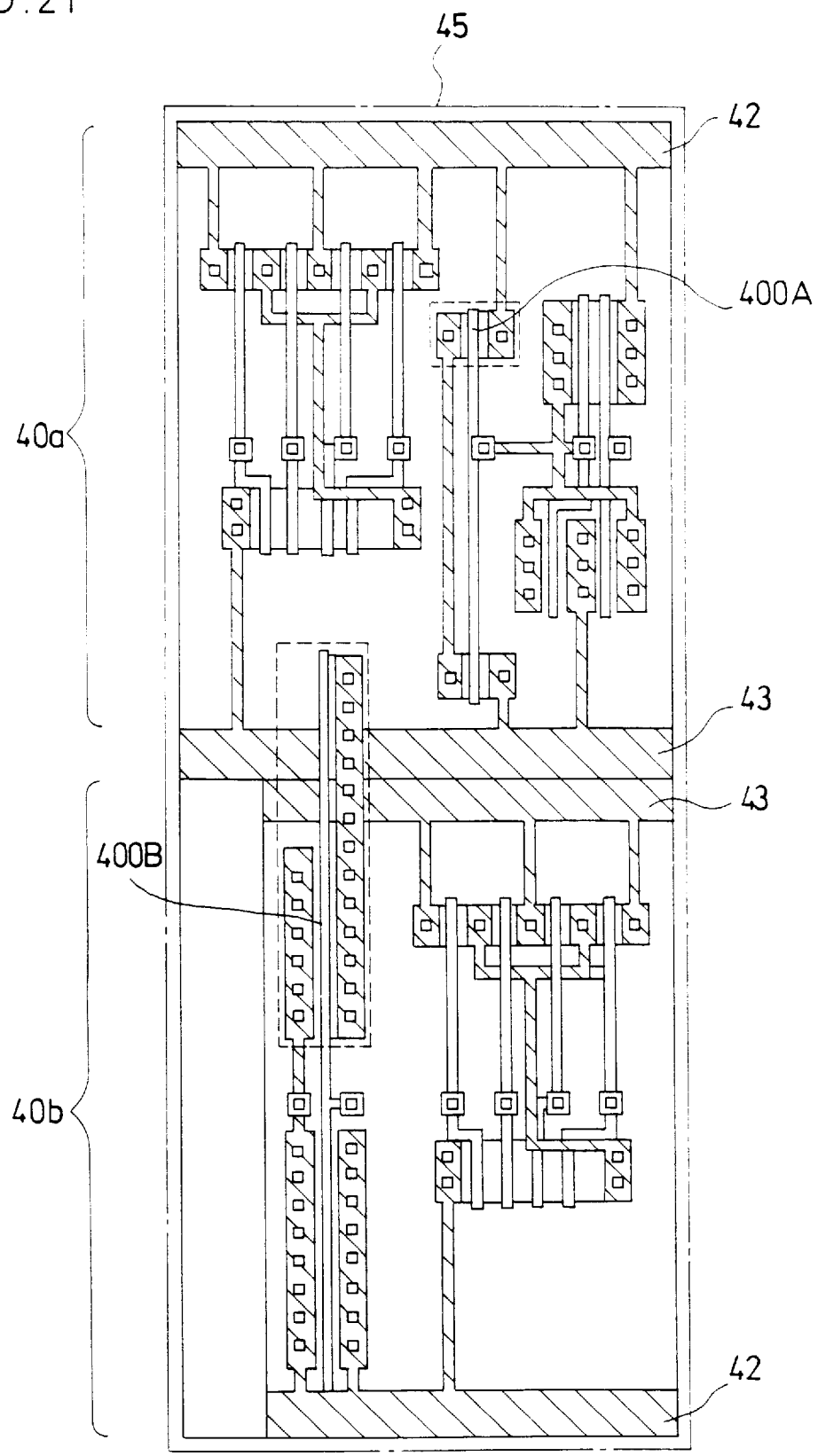
FIG. 21 is a layout view of the layout design result with the cell merge processing according to the fourth embodiment executed.

The following description will discuss the cell merge processing S12 with reference to FIGS. 20 and 21.

FIG. 20 shows an layout designed using the cell placement of the cell placement processing S2 according to a layout design method of prior art. Shown in FIG. 20 are a first cell row 40a, a second cell row 40b, cells 41a, 41b disposed in the first cell row 40a, cells 41c, 41d disposed in the second cell row 40b, power lines 42, and ground lines 43. It is now supposed that each of the cells 41a, 41b, 41d has a shape of 10 in height and 6 in width, and the cell 41c has a shape of 10 in height and 5 in width. Each of pure wiring zones 44 has a height of 4.

In the fourth embodiment, it is now supposed that, after the wiring zone height estimation processing S3 and the cell row height determining processing S11 have been executed after the cell placement processing S2, each of the heights of the first cell row 40a and the second cell row 40b is determined as 14. When the cell row height is set to 14, this makes it possible to dispose the first cell row 40a adjacent to the second cell row 40b. Thus, the cells forming the first cell row 40a and the second cell row 40b are merged. In FIG. 20, the cells of the second cell row 40b are disposed with the upside down such that the ground line 43 of the first cell row 40a does not come in contact with the power line 42 of the second cell row 40b.

At the processing S12a, the first cell row 40a and the second cell row 40b are divided into zones to be merged. One of the zones thus divided is a zone to be merged 45 which contains four cells 41a, 41b, 41c, 41d. In FIG. 21, other portions than the zone to be merged 45 are not shown. At the processing S12e, the transistor placement and wiring information of these cells is acquired from the cell library.

At the processing S12h, the transistor placement and wiring figure is vertically or horizontally compacted such that each height of the first cell row 40a and the second cell row 40b is equal to 14. By such compaction, the figure of transistors and the like can be placed in vacant zones beyond cell boundaries. A big transistor may have to be folded because of the limitation of cell height. When there is a margin in the cell heightwise direction, a transistor may be unfolded vertically, thereby to minimize the transistor mounting area.

FIG. 21 is a layout view illustrating the compaction result. From FIG. 21, it is understood that a transistor 400a in the cell 41b in FIG. 20 is shown at 400A in FIG. 21 and gets into a vacant zone in the cell 41a.

Further, by compaction, a transistor can be unfolded, thereby to minimize the transistor mounting area. The shape of a transistor 400b in the cell 41c in FIG. 20 is changed to 400B as shown in FIG. 21. Thus, it is understood that the transverse width of the transistor is remarkably reduced by unfolding it.

The zones to be merged 45 in FIGS. 20 and 21 are compared with each other. In FIG. 20, the area of the zone to be merged 45 is as follows:

The area of the zone to be merged 45=the area of a portion of the first cell row 40a+the area of a portion of the second cell row 40b+the area of the pure wiring zone 44 (6)

In FIG. 21, the area of the zone to be merged 45 is as follows:

The area of the zone to be merged 45=the area of a portion of the first cell row 40a+the area of a portion of the second cell row 40b (7)

As apparent from the equations (6) and (7), when an increase in the areas of the cell rows due to compaction is smaller than the area of the original pure wiring zone, the zone to be merged is smaller in FIG. 21 than in FIG. 20. In FIG. 20, the zone to be merged 45 has a height of 28 and a width of 12. In FIG. 21, the zone to be merged 45 has a height of 28 and a width of 10. That is, the zone to be merged 45 in FIG. 21 is reduced in area by ⅙. Thus, according to the fourth embodiment, in addition to a change in cell height, compaction is executed to minimize an increase in cell area.

Similar processing is to be made to other zones to be merged before the cell merge processing S12 is finished.

At a wiring processing S5, a detailed wiring design is made based on the assumption of a multi-layer wiring technology as done in a prior art method.

Finally, at a mask pattern preparing processing S6, a mask pattern is prepared based on the cell row layout and the terminal layout obtained by the processings above-mentioned.

(Fifth Embodiment)

In a fifth embodiment of the present invention, the basic processing flow is the same as that in the fourth embodiment and therefore follows the flow chart shown in FIG. 1.

Each of an input processing S1, a cell placement processing S2 and a wiring zone height estimation processing S3 is executed in a manner similar to that in the fourth embodiment. A cell changing processing S4 is executed according to the flow chart in FIG. 17, and a cell row height determining processing S11 is executed in a manner similar to that in the fourth embodiment.

FIG. 22 is a flow chart of a cell merge processing S12 according to the fifth embodiment.

At a processing S51, the information of all the cells forming a cell row is acquired from the cell library information obtained by the input processing S1. At a processing S52, there are estimated the required areas of P- and N-type impurity zones in a cell row. This processing is executed by collectively estimating the numbers and sizes of the P- and N-type transistors, the wiring amount, the number of the contacts and the like.

At a processing S53, the ratio between the P- and N-type impurity zone heights in the cell row height obtained by the cell row height determining processing S11, is changed to the ratio between the P- and N-type impurity zone required areas estimated by the processing S52.

At a processing S54, the layout is vertically or horizontally compacted, likewise in the fourth embodiment, using the information acquired by the processing S51 and according to the P- and N-type impurity zone heights obtained by the processing S53, such that a plurality of cells is merged into one cell.

Figure 23A:
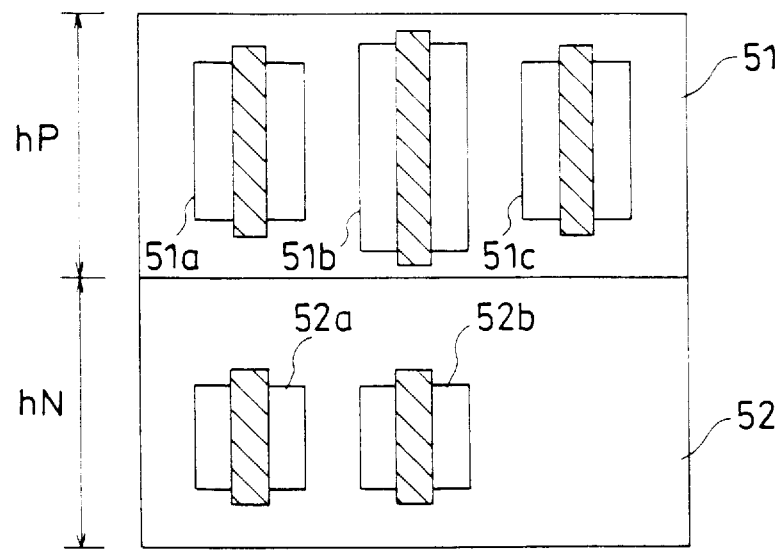
Figure 23B:
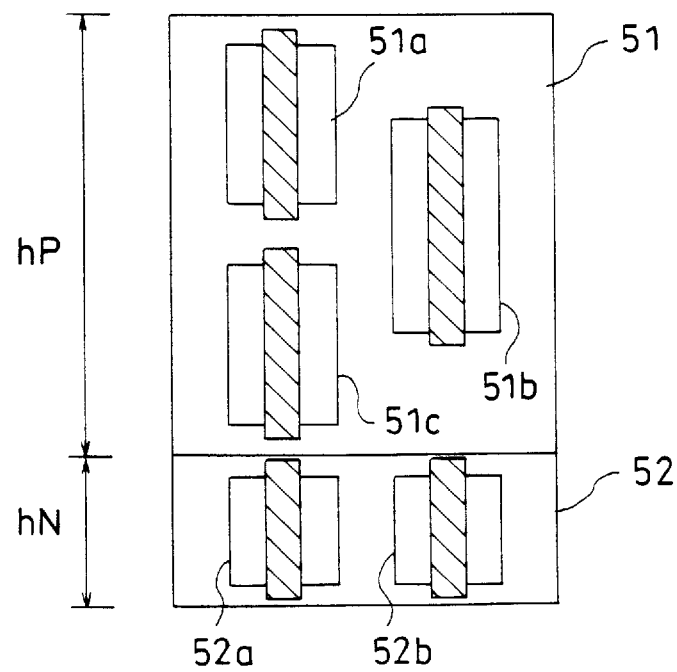
FIG. 23(b) is a layout view of the layout design result with the cell merge processing according to the fifth embodiment executed.
Figure 24:
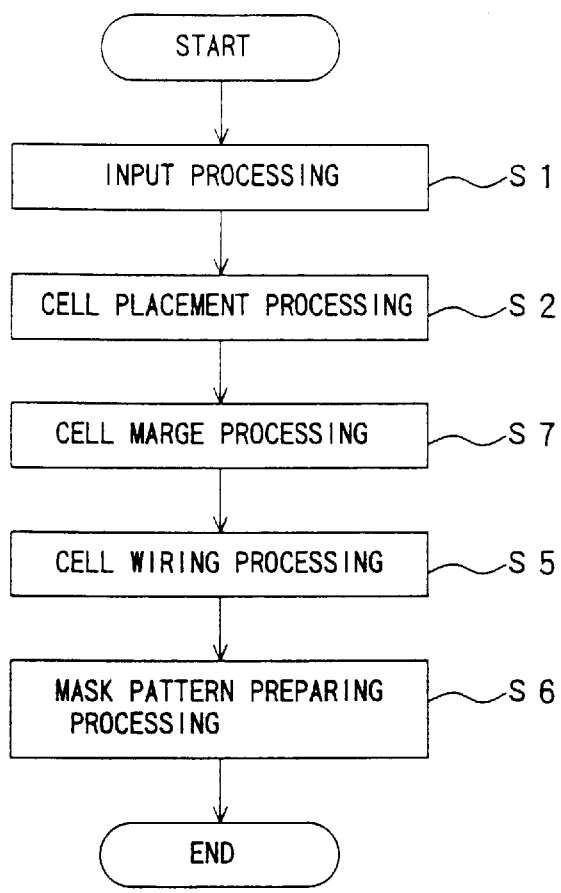
FIG. 24 is a flow chart illustrating a basic processing flow of layout design method of prior art.

FIG. 23(a) and (b) are views illustrating the fifth embodiment. FIG. 23(a) shows a layout obtained without the cell merge processing S12 according to the fifth embodiment executed, and FIG. 23(b) shows a layout obtained with the cell merge processing S12 according to the fifth embodiment executed. Shown in each of FIG. 23(a) and (b) are a P-type impurity zone 51, an N-type impurity zone 52, P-type transistors 51a, 51c each having an area of 3, a P-type transistor 51b having an area of 4, and N-type transistors 52a, 52b each having an area of 2. The total area of the three P-type transistors is equal to 10, while the total area of the two N-type transistors is equal to 4. The P-type impurity zone has a height hP, while the N-type impurity zone has a height hN.

In FIG. 23(a), the P-type impurity zone height hP is equal to the N-type impurity zone height hN. On the other hand, in FIG. 23(b), the required area of the P-type impurity zone is 10 and the required area of the N-type impurity zone is 4 such that the ratio of the P-type impurity zone height hP to the N-type impurity zone height hN in the cell row height is changed to 10:4. Thus, it is understood that, even though the cell heights are the same, the cell width is smaller in FIG. 23(b) than in FIG. 23(a).

At a wiring processing S5, a detailed wiring design is made based on the assumption of a multi-layer wiring technology as done in a prior art method.

Finally, at a mask pattern preparing processing S6, a mask pattern is prepared based on the layout of cells and cell interconnection.

(Sixth Embodiment)

It is an object of a sixth embodiment of the present invention to reduce, in an arrangement always requiring a pure wiring zone between cell rows, the width of a cell row by compacting a plurality of cells of the cell row into one cell, resulting in a reduction in the block area. For example, a pure wiring zone between cell rows is always required when the layout is to be designed based on the assumption of a two-layer wiring technology and the space over each cell cannot be utilized for wiring.

Figure 28:
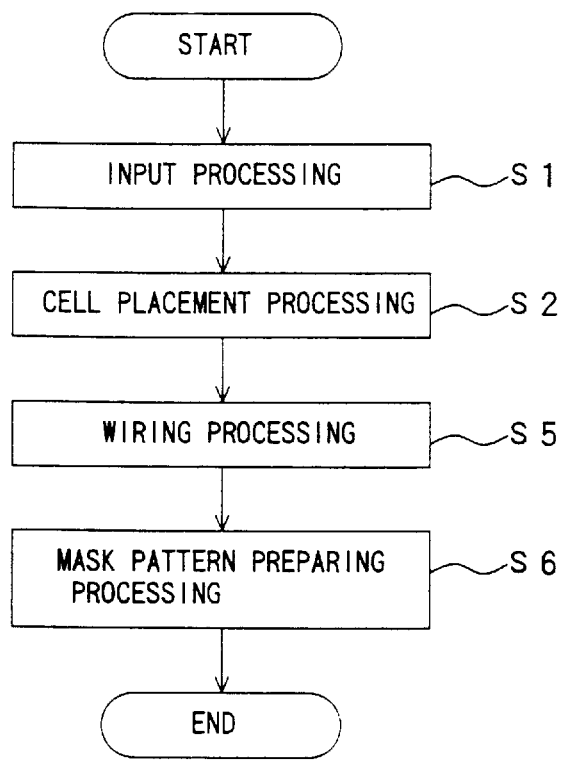
FIG. 28 is a flow chart illustrating a basic processing flow of an LSI layout design method according to a sixth embodiment of the present invention.
Figure 29:
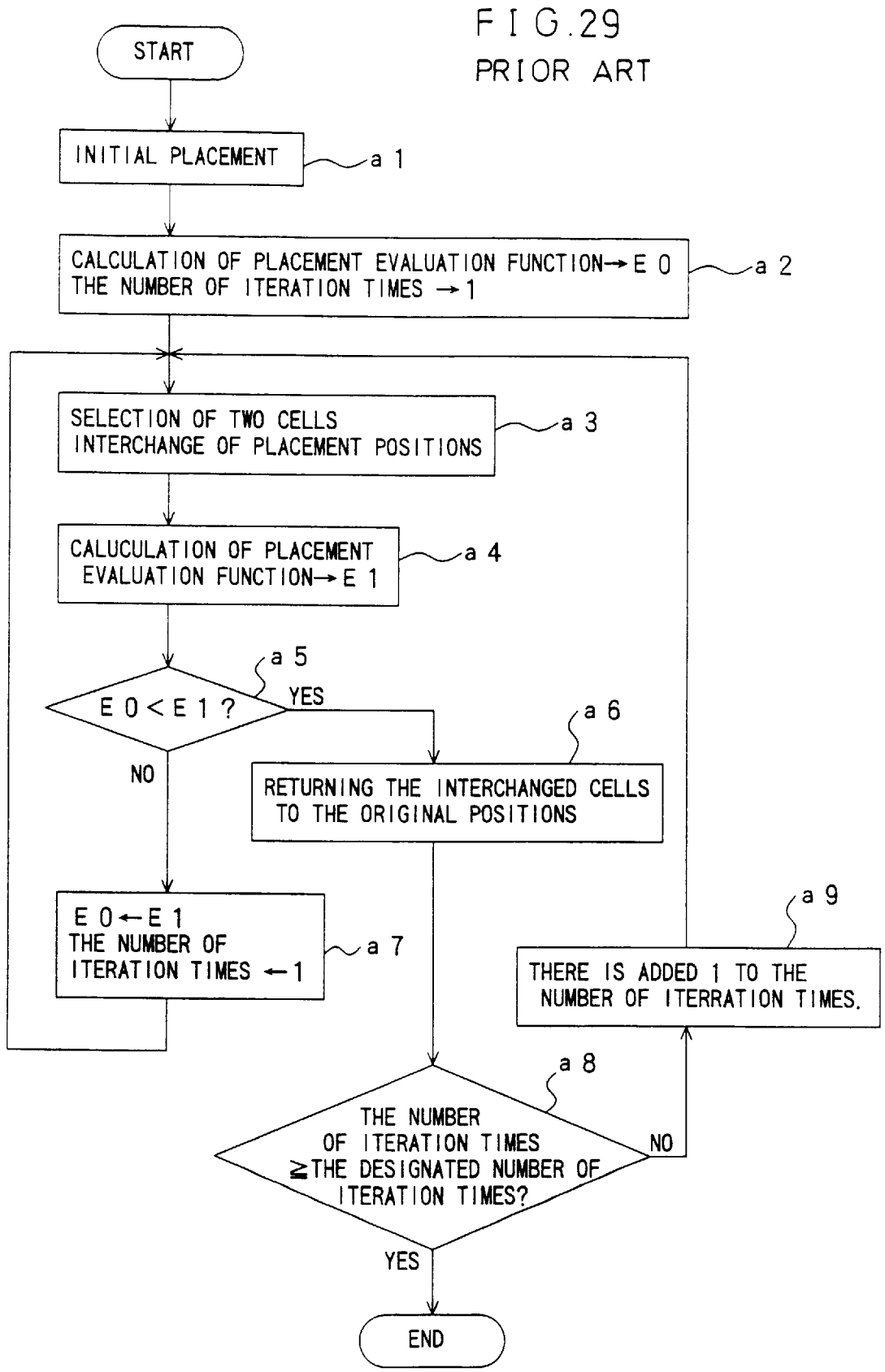
FIG. 29 is a flow chart illustrating a pairwise interchange method.
Figure 30:
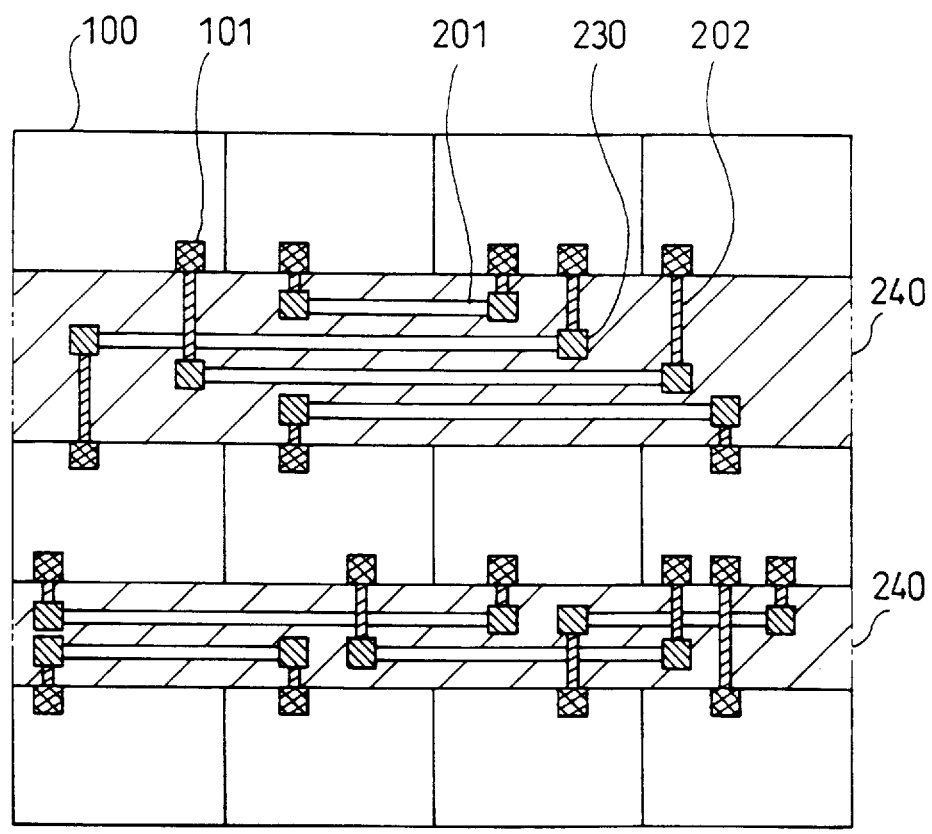
FIG. 30 is a layout view of the layout design result obtained by a prior art method based on the assumption of a two-layer wiring.
Figure 31:
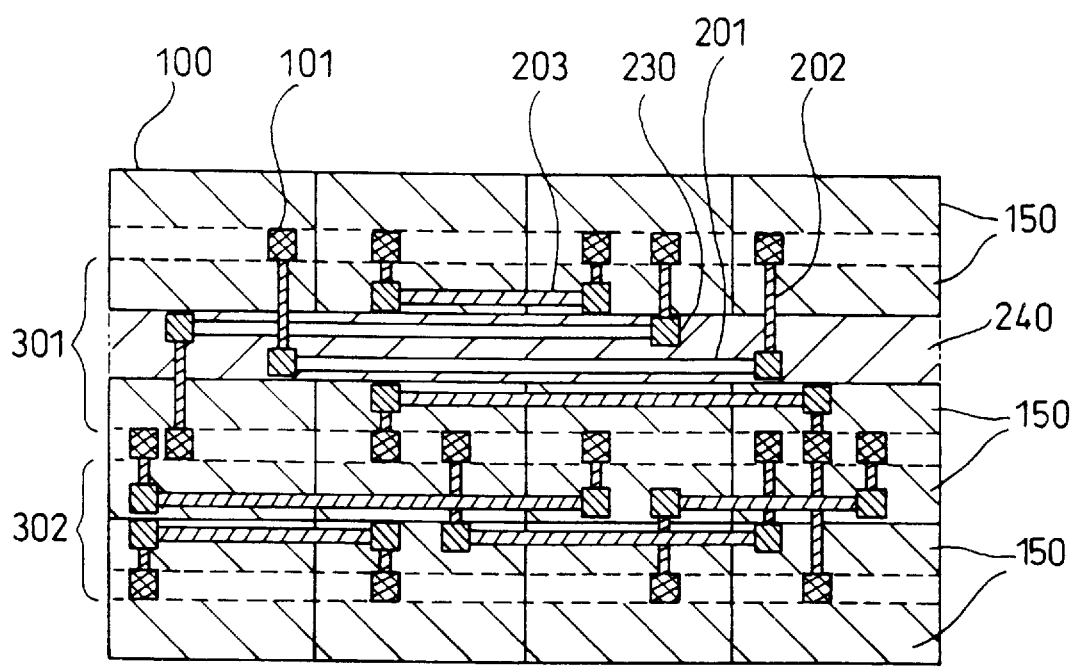
FIG. 31 is a layout view of the layout design result obtained by a prior art method based on the assumption of a multi-layer wiring technology.

FIG. 28 is a flow chart illustrating a basic processing flow of an LSI layout design method according to the sixth embodiment of the present invention.

Each of an input processing S1 and a cell placement processing S2 is executed in a manner similar to that in the fourth embodiment.

Figure 25:
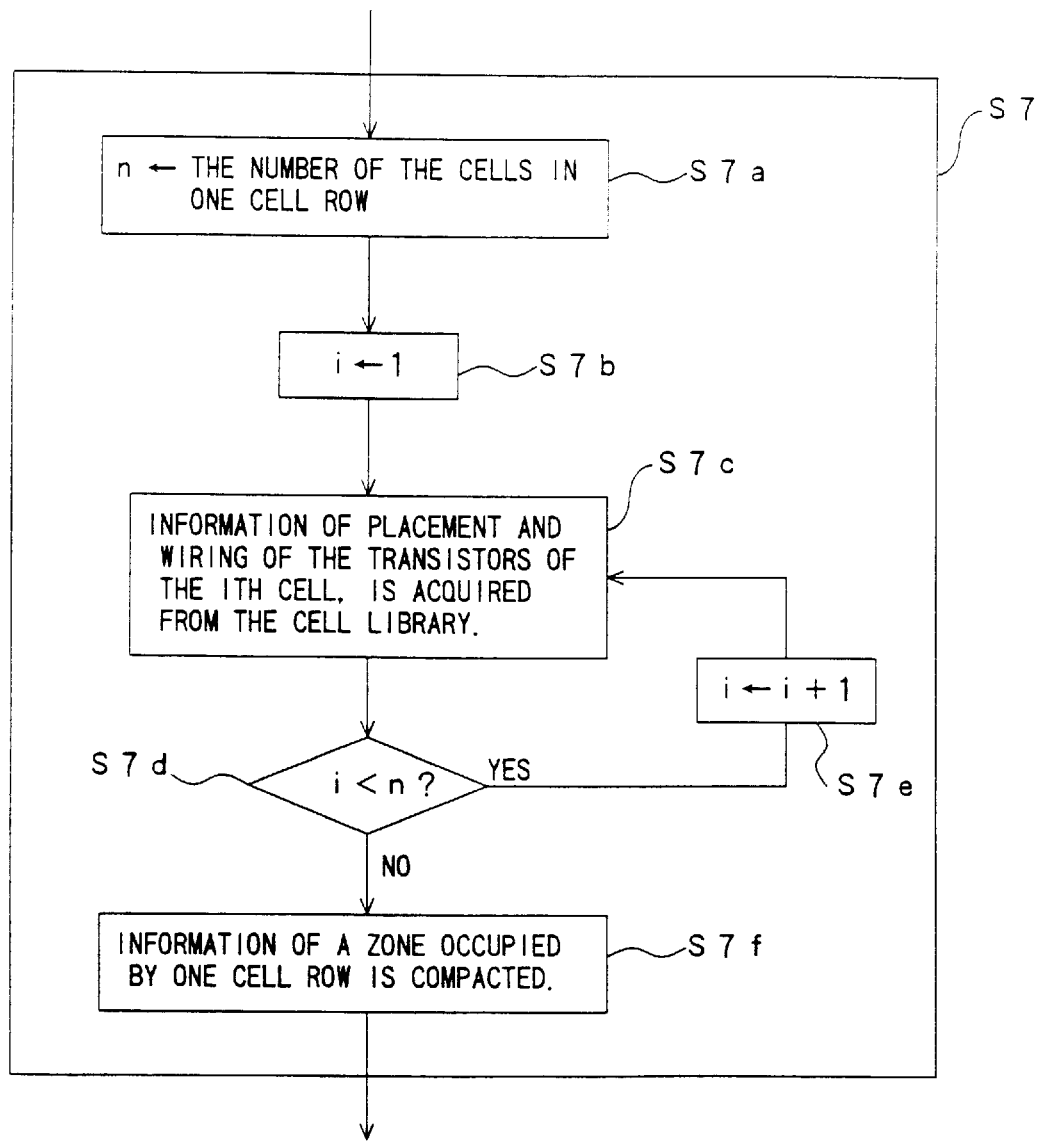
FIG. 25 is a flow chart illustrating the flow of a cell merge processing according to the sixth embodiment.

Then, there is executed a cell merge processing S7 for merging a plurality of cells into one cell. FIG. 25 is a flow chart of the cell merge processing S7 according to the sixth embodiment.

The number of the cells of a cell row to be compacted is set to n at a processing S7a, and 1 is set to n at a processing S7b. At a processing S7c, the transistor placement and wiring information for the ith cell is acquired from the cell library. At a processing S7d, it is judged whether or not i is smaller than n. When i is smaller than n, 1 is added to i at a processing S7e and the processing S7c is executed again. When i is not smaller than n, the processing proceeds to a processing S7f. As a result, there is acquired the transistor placement and wiring information for all the cells of a cell row to be compacted.

At a processing S7f, the acquired transistor placement and wiring figure is vertically or horizontally compacted in a zone occupied by one cell row. This processing can be executed using the method discussed in connection with the fourth embodiment.

Figure 26:
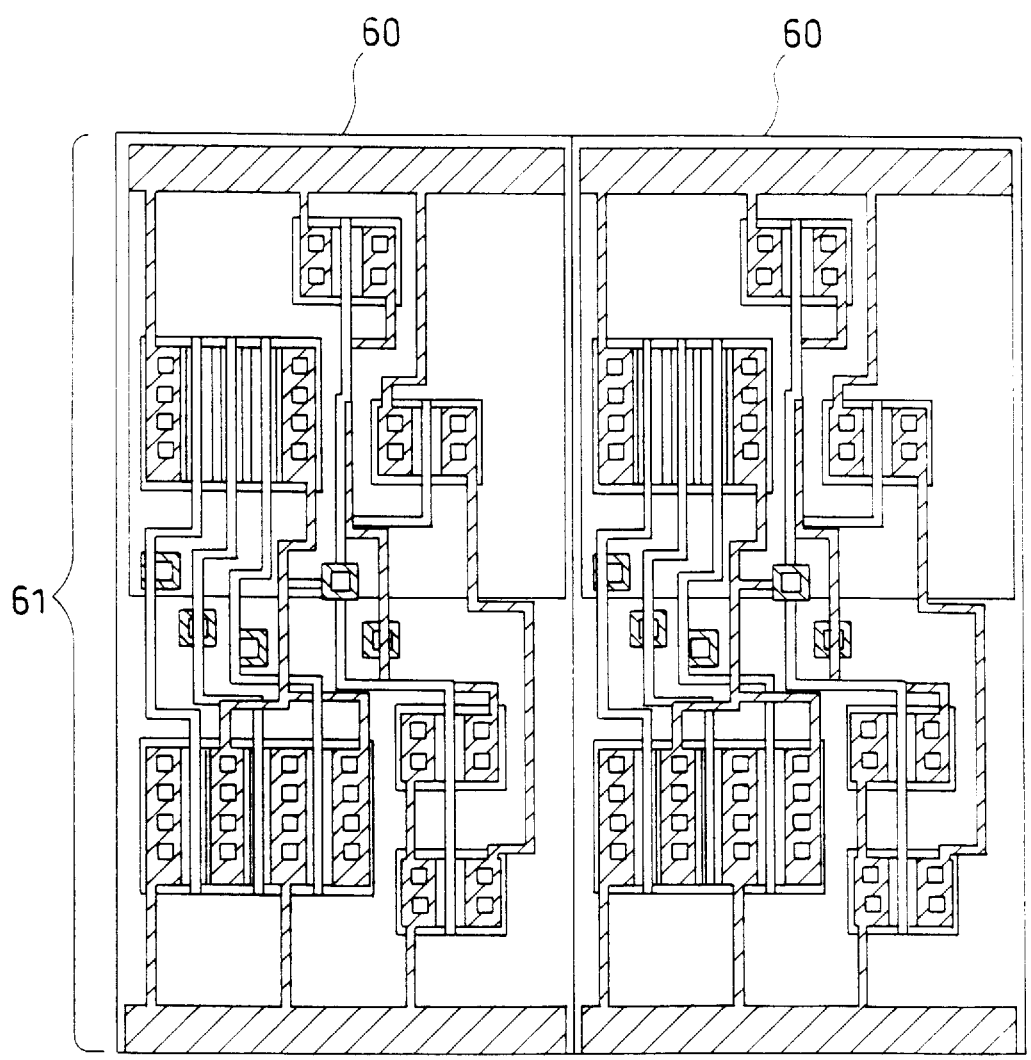
FIG. 26 is a layout view of the layout design result without the cell merge processing according to the sixth embodiment executed.
Figure 27:
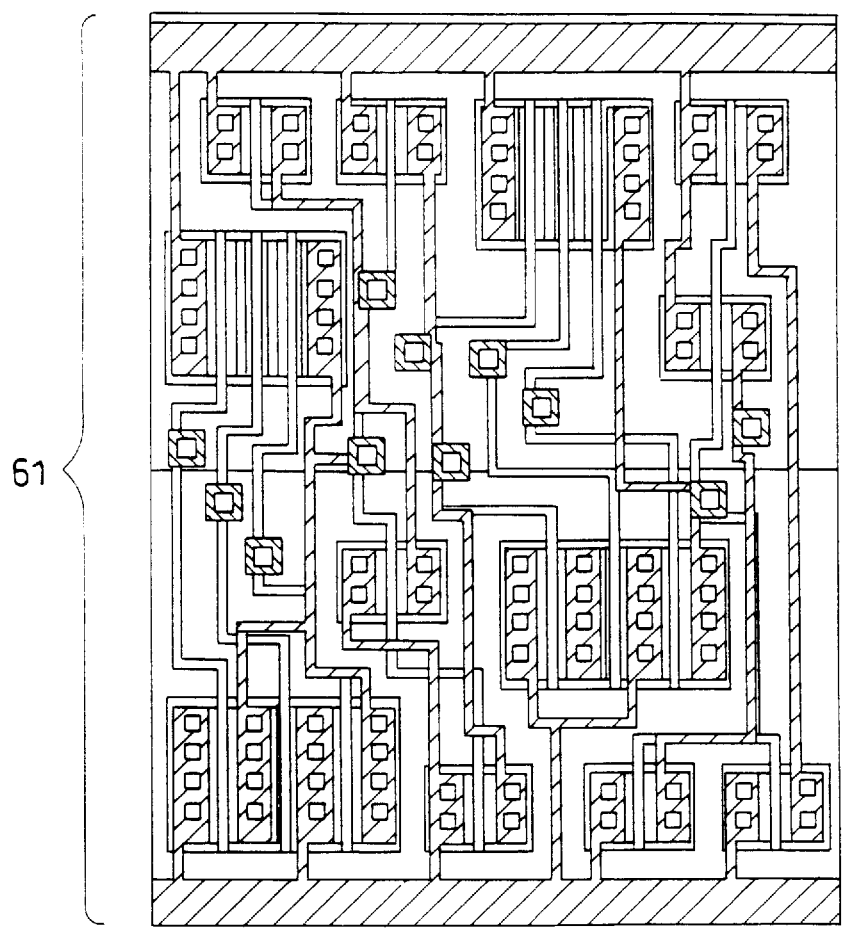
FIG. 27 is a layout view of the layout design result with the cell merge processing according to the sixth embodiment executed.

FIG. 26 is a layout obtained without the cell merge processing S7 according to the sixth embodiment executed, and FIG. 27 is a layout obtained with the cell merge processing S7 according to the sixth embodiment executed. Shown in FIG. 26 are a cell row 61 in which two cells 60 are disposed. From FIG. 26, it is understood that some vacant zones are present in each of the cells 60. After the cell merge processing S7 is executed on the cell row 61, there is obtained a layout as shown in FIG. 27. It is apparent from FIG. 27 that the cell row 61 presents a highly dense layout substantially containing no vacant zones. The cell row 61 in FIG. 27 is reduced in cell row width by about 15% as compared with the cell row 61 in FIG. 26.

Then, each of a wiring processing S5 and a mask pattern preparing processing S6 is executed in a manner similar to that in the fourth embodiment.

In the sixth embodiment, each cell has an arrangement where the power source and the grounding are respectively disposed at upper and lower positions of the cell. However, even though the power source and the grounding are disposed at other positions, similar effects may also be produced.

Further, in the sixth embodiment, the cell row height determining processing S11 is a mere example, and may be executed by other method capable of assuring to produce no pure wiring zone.

Further, the placement technology used in the sixth embodiment is a mere example, and the use of other cell placement technology may also produce similar effects as those produced by the sixth embodiment.

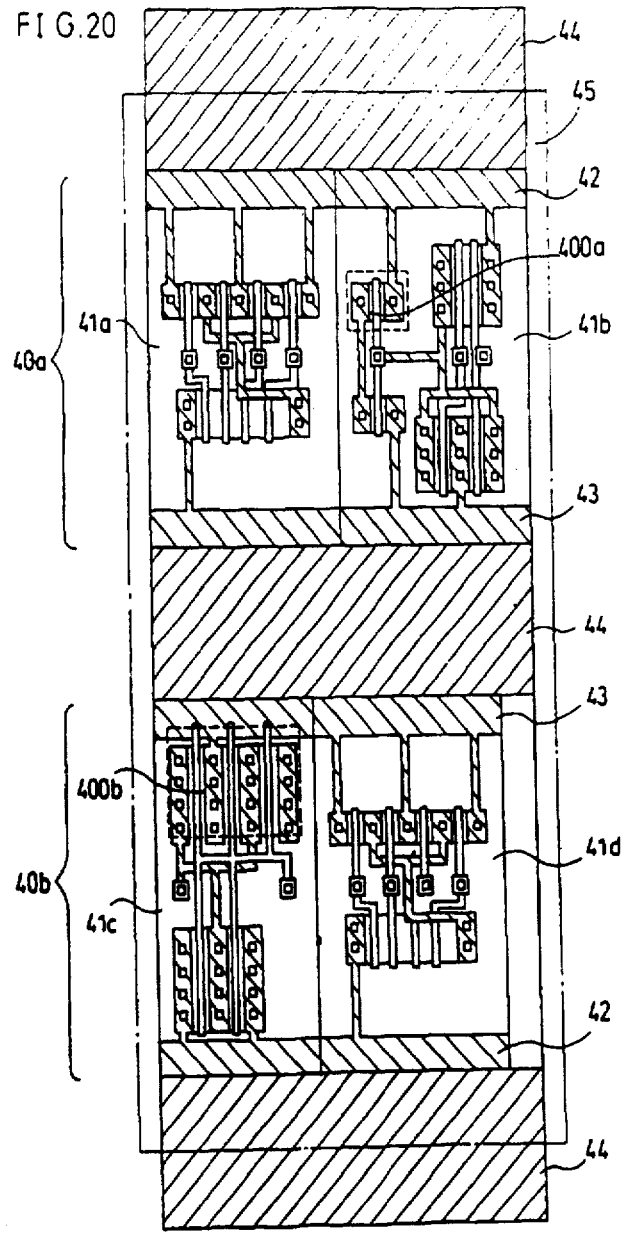

What is claimed is:

1. An LSI layout design method of designing, according to circuit design information, a layout of cells and cell interconnection on a semiconductor substrate and preparing a mask pattern based on the layout thus designed, comprising:

an input processing for entering circuit design information and the information of a cell group which can be placed;

a cell placing processing for selecting cells from said cell group which can be placed, and for two-dimensionally placing said cells thus selected on a plane according to said circuit design information, thereby to design a layout of said selected cells arranged in a plurality of parallel cell rows;

a wiring zone height estimating processing for estimating, in said cell layout designed by said cell placing processing, the wiring zone height or length in a direction at a right angle to said cell rows, of a necessary wiring zone required between two adjacent cell rows for the purpose of wiring;

a cell changing processing for amending said cell layout by changing a cell placed on said cell layout designed by said cell placing processing, to a cell which has the same specifications and a different shape or a different cell terminal position and which is contained in said cell group which can be placed, thereby to reduce the area of a pure wiring zone disposed solely for the purpose of wiring, said pure wiring zone being required for assuring said wiring zone height of said necessary wiring zone, in addition to the over-the-cell wiring zones where wiring can be made on cells;

a wiring processing for designing a layout of cell interconnection according to said cell layout amended by said cell changing processing and according to said circuit design information; and a mask pattern preparing processing for preparing a mask pattern based on said layout of cell and cell interconnection designed by said processings above-mentioned, wherein said cell changing processing comprises:

a cell row height determining processing for obtaining a cell row height such that said wiring zone height of said necessary wiring zone is assured in said over-the-cell wiring zone;

a cell merge processing for (i) acquiring, from said information entered by said input processing relating to said cell group which can be placed, the figure information of placement and wiring of transistors of cells forming each cell row, (ii) merging a plurality of cells of one cell row or two adjacent cell rows, into one cell, and (iii) vertically or horizontally compacting the figure of placement and wiring of the transistors of said plurality of cells such that the height of each of said cell rows is equal to said cell row height obtained by said cell row height determining processing; and a processing for changing a plurality of cells out of said cells placed by said cell placing processing, to a cell obtained by said cell merge processing.

2. An LSI layout design method according to claim 1, wherein said cell merge processing comprises:

a zones-to-be-merged dividing processing for dividing a zone occupied by one cell row or by two adjacent columns, into a plurality of zones to be merged; and a processing for merging, into one cell, a plurality of cells in each of said zones to be merged thus divided, and vertically or horizontally compacting the figure of placement and wiring of the transistors of said plurality of cells.

3. An LSI layout design method according to claim 1, wherein said cell merge processing comprises:

a necessary area estimating processing for estimating the necessary area of each of P-and N-type impurity zones in at least one cell row; and a processing for merging a plurality of cells of each cell row into one cell and vertically or horizontally compacting the figure of placement and wiring of the transistors of said plurality of cells such that the ratio of the P-type impurity zone height to the N-type impurity zone height within said cell row height obtained by said cell row height determining processing, is equal to the ratio of said P-type impurity zone necessary area to said N-type impurity zone necessary area, said necessary areas being obtained by said necessary area estimating processing.

4. An LSI layout design apparatus for designing, in an LSI design process, a layout of cells and cell interconnection on a semiconductor substrate according to circuit design information, and preparing a mask pattern based on the layout thus designed, comprising:

an input means for entering circuit design information and the information of a cell group which can be placed:

a cell placing means for selecting cells from said cell group which can be placed, and for two-dimensionally placing said cells thus selected on a plane according to said circuit design information entered by said input means, thereby to design a layout of said selected cells arranged in a plurality of parallel cell rows;

a wiring zone height estimating means for estimating, in said cell layout designed by said cell placing means, the wiring zone height or length in a direction at a right angle to said cell rows, of a necessary wiring zone required between two adjacent cell rows for the purpose of wiring;

a cell changing means for amending said cell layout by changing a cell placed on said cell layout designed by said cell placing means, to a cell which has the same specifications and a different shape or a different cell terminal position and which is contained in said cell group which can be placed, thereby to reduce the area of pure 45 wiring zone disposed solely for the purpose of wiring, said pure wiring zone being required for assuring said wiring zone height of said necessary wiring zone, in addition to the over-the-cell wiring zones where wiring can be made on cells:

a wiring means for designing a layout of cell interconnection according to said cell layout amended by said cell changing means and according to said circuit design information; and a mask pattern preparing means for preparing a mask pattern based on said layout of cell interconnection designed by said means above-mentioned, wherein said cell changing processing comprises:

a cell row height determining means for obtaining a cell row height such that said wiring zone height of said necessary wiring zone is assured in said over-the-cell wiring zone;

a cell merge means for (i) acquiring, from said information entered by said input means relating to said cell group which can be placed, the figure information of placement and wiring of transistors of cells forming each cell row, (ii) merging a plurality of cells of one cell row or two adjacent cell rows, into one cell, and (iii) vertically or horizontally compacting the figure of placement and wiring of the transistors of said plurality of cells such that the height of each of said cell rows is equal to said cell row height obtained by said cell row height determining means; and a means for changing a plurality of cells out of said cells placed by said cell placing means, to a cell obtained by said cell merge means.

5. An LSI layout design apparatus according to claim 4, wherein said cell merge means comprises:

a zones-to-be-merged dividing means for dividing a zone occupied by one cell row or two adjacent columns, into a plurality of zones to be merged; and a means for merging, into one cell, a plurality of cells in each of said zones to be merged thus divided, and vertically or horizontally compacting the figure of placement and wiring of the transistors of said plurality of cells.

6. An LSI layout design apparatus according to claim 4, wherein said cell merge means comprises:
- a necessary area estimating means for estimating the necessary area of each of P- and N-type impurity zones in at least one cell row; and
- a means for merging a plurality of cells of each cell row into one cell and vertically or horizontally compacting the figure of placement and wiring of the transistors of said plurality of cells such that the ratio of the P-type impurity zone height to the N-type impurity zone height within said cell row height obtained by said cell row height determining means, is equal to the ratio of said P-type impurity zone necessary area to said N-type impurity zone necessary area, said necessary areas being obtained by said necessary area estimating means.

* * * * *

UNITED STATES PATENT AND TRADEMARK OFFICE
CERTIFICATE OF CORRECTION

| | |
|---|---|
| PATENT NO. : | 5,852,562 |
| DATED : | December 22, 1998 |
| INVENTOR(S) : | Noriko SHINOMIYA et al. |

It is certified that error appears in the above-identified patent and that said Letters Patent is hereby corrected as shown below:

On the title page

<u>item [54]</u>, line 3, after "LAYOUT" insert --BY--.

Signed and Sealed this

First Day of June, 1999

Attest:

Q. TODD DICKINSON

*Attesting Officer*          *Acting Commissioner of Patents and Trademarks*

UNITED STATES PATENT AND TRADEMARK OFFICE
CERTIFICATE OF CORRECTION

PATENT NO. : 5,852,562
DATED : December 22, 1998
INVENTOR(S) : Noriko Shinomiya, et al.

It is certified that error appears in the above-identified patent and that said Letters Patent is hereby corrected as shown below:

Column 1,
Line 2, in the title, after "LAYOUT", insert -- BY --.

Signed and Sealed this

Sixth Day of November, 2001

Attest:

NICHOLAS P. GODICI
Attesting Officer   Acting Director of the United States Patent and Trademark Office

UNITED STATES PATENT AND TRADEMARK OFFICE
CERTIFICATE OF CORRECTION

PATENT NO. : 5,852,562
DATED : December 22, 1998
INVENTOR(S) : Noriko Shinomiya, et al.

It is certified that error appears in the above-identified patent and that said Letters Patent is hereby corrected as shown below:

Drawings,
FIG. 20, change the reference character "45" lead-line to correctly designate the zone to be merged, namely, the zone bounded by a dot-dash line as shown at right: